(12) United States Patent
Tani et al.

(10) Patent No.: US 9,229,480 B2
(45) Date of Patent: Jan. 5, 2016

(54) ELECTRONIC DEVICE HAVING A DISPLAY UNIT AND A MAIN UNIT ROTATABLY CONNECTED TOGETHER BY A HINGE

(71) Applicant: Sony Corporation, Tokyo (JP)

(72) Inventors: Atsushi Tani, Nagano (JP); Akira Hanatsuka, Nagano (JP); Shingo Harada, Nagano (JP)

(73) Assignee: Sony Corporation (JP)

( * ) Notice: Subject to any disclaimer, the term of this patent is extended or adjusted under 35 U.S.C. 154(b) by 84 days.

(21) Appl. No.: 14/064,500

(22) Filed: Oct. 28, 2013

(65) Prior Publication Data

US 2014/0355187 A1  Dec. 4, 2014

(30) Foreign Application Priority Data

May 28, 2013 (JP) ................................. 2013-112336

(51) Int. Cl.
*G06F 1/16* (2006.01)
*H05K 5/00* (2006.01)
*H05K 7/00* (2006.01)
*H05K 7/16* (2006.01)

(52) U.S. Cl.
CPC ............ *G06F 1/1637* (2013.01); *G06F 1/1624* (2013.01); *G06F 1/1662* (2013.01); *G06F 1/1681* (2013.01); *H05K 7/16* (2013.01)

(58) Field of Classification Search
CPC ... G06F 1/1601; G06F 1/1616; G06F 1/1681; G06F 1/1679; G06F 1/1656; G06F 1/1683; G06F 1/1637; G06F 3/0202; G06F 1/1666; G06F 1/1669; F16M 11/10; G02F 1/133308
See application file for complete search history.

(56) References Cited

U.S. PATENT DOCUMENTS

| 5,200,913 | A | * | 4/1993 | Hawkins et al. | 361/679.09 |
| 5,383,138 | A | * | 1/1995 | Motoyama et al. | 361/679.27 |
| 5,481,430 | A | * | 1/1996 | Miyagawa et al. | 361/679.09 |
| 6,353,529 | B1 | * | 3/2002 | Cies | 361/679.05 |
| 6,464,195 | B1 | * | 10/2002 | Hildebrandt | 248/460 |
| 6,798,649 | B1 | * | 9/2004 | Olodort et al. | 361/679.13 |
| 6,816,365 | B2 | * | 11/2004 | Hill et al. | 361/679.44 |
| 6,822,857 | B2 | * | 11/2004 | Jung et al. | 361/679.02 |
| 6,826,043 | B2 | * | 11/2004 | Chang | 361/679.27 |

(Continued)

FOREIGN PATENT DOCUMENTS

| EP | 1 513 047 | A2 | * | 7/2004 | ................ G06F 1/16 |
| EP | 1513047 | A2 | | 3/2005 | |

(Continued)

OTHER PUBLICATIONS

Extended European Search Report for EP Application No. 13191309.7, dated Jan. 16, 2015.

*Primary Examiner* — Hoa C Nguyen
*Assistant Examiner* — Xanthia C Cunningham
(74) *Attorney, Agent, or Firm* — Lerner, David, Littenberg, Krumholz & Mentlik, LLP

(57) ABSTRACT

There is provided an electronic device including a flat main unit provided with a keyboard, a flat display unit having a display face, the flat display unit configured to movably slide between a first state that overlaps the main unit and a second state that is erect with respect to the main unit, and a hinge that is arranged so as to overlap the keyboard in the first state, and is configured to couple the main unit and the display unit together so that the display unit can move with respect to the main unit.

8 Claims, 29 Drawing Sheets

(56) References Cited

U.S. PATENT DOCUMENTS

| | | | |
|---|---|---|---|
| 6,961,234 B2* | 11/2005 | Tanaka et al. | 361/679.27 |
| 7,158,634 B2* | 1/2007 | Eromaki | 379/433.13 |
| 7,203,058 B2* | 4/2007 | Hong | 361/679.06 |
| 7,384,019 B2* | 6/2008 | Choi | 248/136 |
| 7,513,468 B2* | 4/2009 | Jung et al. | 248/133 |
| 7,551,426 B2* | 6/2009 | Huang et al. | 361/679.02 |
| 7,567,436 B2* | 7/2009 | Jeong | 361/679.22 |
| 7,597,302 B2* | 10/2009 | Lee et al. | 248/371 |
| 7,990,694 B2 | 8/2011 | Goto | |
| 8,446,717 B2* | 5/2013 | Tanaka et al. | 361/679.27 |
| 8,467,184 B2* | 6/2013 | Chen et al. | 361/679.55 |
| 8,713,758 B2* | 5/2014 | Mitsui et al. | 16/357 |
| 2003/0142474 A1* | 7/2003 | Karidis et al. | 361/683 |
| 2004/0160738 A1* | 8/2004 | Chen et al. | 361/683 |
| 2006/0077622 A1* | 4/2006 | Keely et al. | 361/681 |
| 2007/0030634 A1* | 2/2007 | Maskatia | 361/683 |
| 2008/0192424 A1* | 8/2008 | Lee | 361/683 |
| 2011/0249389 A1 | 10/2011 | Goto | |

FOREIGN PATENT DOCUMENTS

| | | |
|---|---|---|
| EP | 2472347 A2 | 7/2012 |
| JP | 2009-230244 A | 10/2009 |

\* cited by examiner

FIG. 19
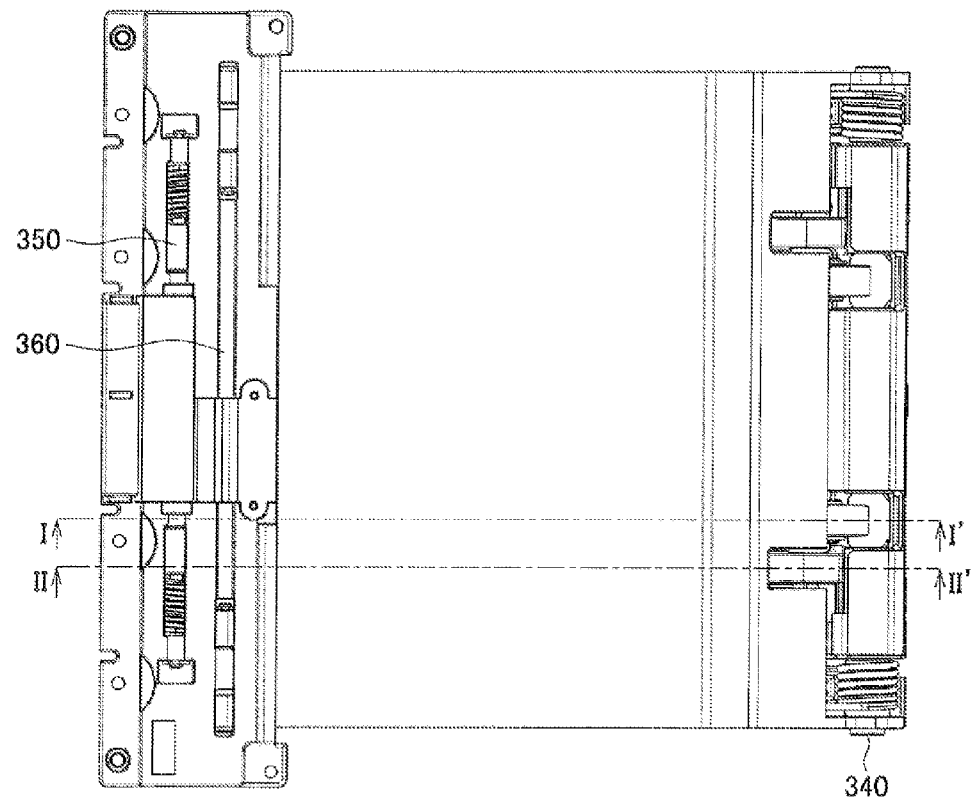
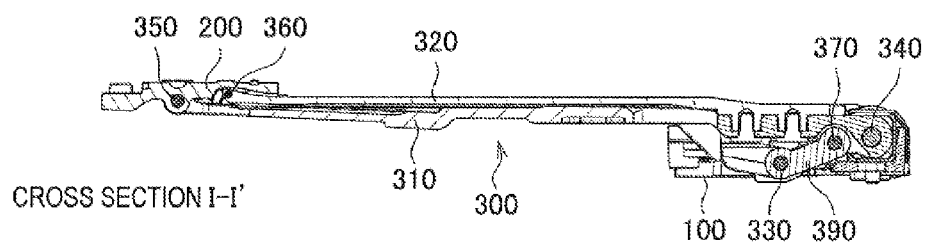
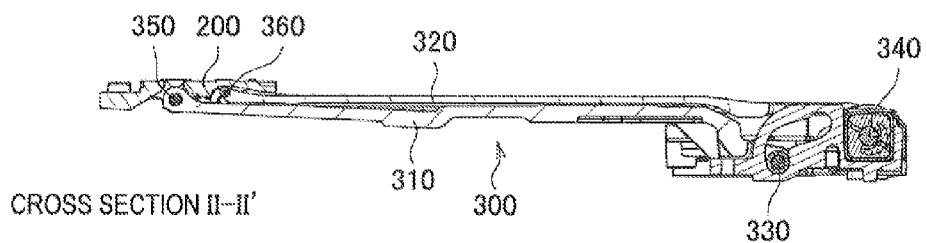

ELECTRONIC DEVICE HAVING A DISPLAY UNIT AND A MAIN UNIT ROTATABLY CONNECTED TOGETHER BY A HINGE

CROSS REFERENCE TO RELATED APPLICATIONS

This application claims the benefit of Japanese Priority Patent Application JP 2013-112336 filed May 28, 2013, the entire content of which is incorporated herein by reference.

BACKGROUND

The present disclosure relates to an electronic device.

JP-A-2009-230244, for example, describes an apparatus that slides and tilts up/down a display unit with respect to a main unit. This apparatus includes a main unit that has a keyboard on its upper face for inputting information, and a display unit that has on its upper face a display for displaying information. The apparatus slides and tilts up/down the display unit with respect to the main unit with a slide mechanism and a tilt up/down mechanism.

SUMMARY

However, in the configuration described in JP-A-2009-230244, since the display unit is provided with a hinged support to the main unit at two locations on either end in the width direction of the main body, and a hinged support near the center in the depth direction of the main unit, the keyboard space can be severely restricted. Consequently, this makes it especially hard to widen the space in the depth direction of the apparatus, which can mean that only a very compact keyboard can be mounted in the flat space of the main unit. Therefore, it has been difficult to arrange constituent elements such as a touch pad or a palm rest in front of the keyboard.

Further, in the configuration described in JP-A-2009-230244, since a slide guide (groove) for sliding the display unit is provided at either end of the main unit, space in the main unit is taken up by this slide guide, which further hinders making the apparatus more compact and thin.

Consequently, one way to obtain the maximum possible keyboard space and to obtain a more compact and thinner apparatus would be to connect the main unit and the display unit via a hinge. However, if the main unit and the display unit are connected via a hinge, this means that there will be restrictions on the area where the keyboard is arranged in order to prevent the hinge and the keyboard from interfering with each other. Consequently, it has been difficult to reduce the size of the keyboard or to arrange a touch pad, an armrest and the like in front of the keyboard.

Further, when a hinge is used, the hinge and the main unit are rotatably coupled about a rotating central shaft, and the hinge and the display unit are also rotatably coupled about a rotating central shaft. However, in such a configuration, while the display unit is moving, the display unit is restricted to facing in a predetermined direction. However, if two overlapping hinges are provided in order to define the direction that the display faces with respect to the main unit while the display unit is moving, this means that the movement of the display unit is severely restricted. Therefore, it has been difficult to configure so that the display unit can move in a desired manner with respect to the main unit.

Accordingly, in a configuration in which a main unit and a display unit are connected via a hinge, it is desired to configure so that the display unit that is moving respect to the main unit can be moved in a desired manner.

According to an embodiment of the present disclosure, there is provided an electronic device including a flat main unit provided with a keyboard, a flat display unit having a display face, the flat display unit configured to movably slide between a first state that overlaps the main unit and a second state that is erect with respect to the main unit, and a hinge that is arranged so as to overlap the keyboard in the first state, and is configured to couple the main unit and the display unit together so that the display unit can move with respect to the main unit. The hinge includes a first hinge member that is rotatably configured about a first rotating central shaft with respect to the main unit and rotatably configured about a second rotating central shaft with respect to the display unit, and a second hinge member that is rotatably configured about a third rotating central shaft with respect to the main unit and rotatably configured about a fourth rotating central shaft with respect to the display unit. The hinge is configured so that the first rotating central shaft moves along a predetermined curve when the display unit moves between the first state and the second state with respect to the main unit.

A cam groove may be formed by the predetermined curve on the main unit, and the first rotating central shaft may move along the cam groove.

When the display unit is moved from the first state to the second state by the first rotating central shaft moving along the predetermined curve, a lower edge of the display unit may move across an upper face of the main unit.

When the display unit is moved from the first state to the second state by the first rotating central shaft moving along the predetermined curve, in between the first state and the second state, a lower edge of the display unit may move so as to rise above an upper face of the main unit.

An upper face of the keyboard may be slanted with respect to an upper face of the main unit.

The hinge may be arranged so as to extend toward a center in a width direction of the keyboard.

A pointing device may be provided at an area on a near side of the keyboard.

The first and the second rotating central shafts may be arranged in parallel on the main unit.

According to one or more of embodiments of the present disclosure, in a configuration in which a main unit and a display unit are connected via a hinge, the display unit that is moving respect to the main unit can be moved in a desired manner.

BRIEF DESCRIPTION OF THE DRAWINGS

FIG. 19 is a schematic diagram illustrating a detailed configuration of the hinge and the curved cam;

DETAILED DESCRIPTION OF THE EMBODIMENT(S)

Figure 1:
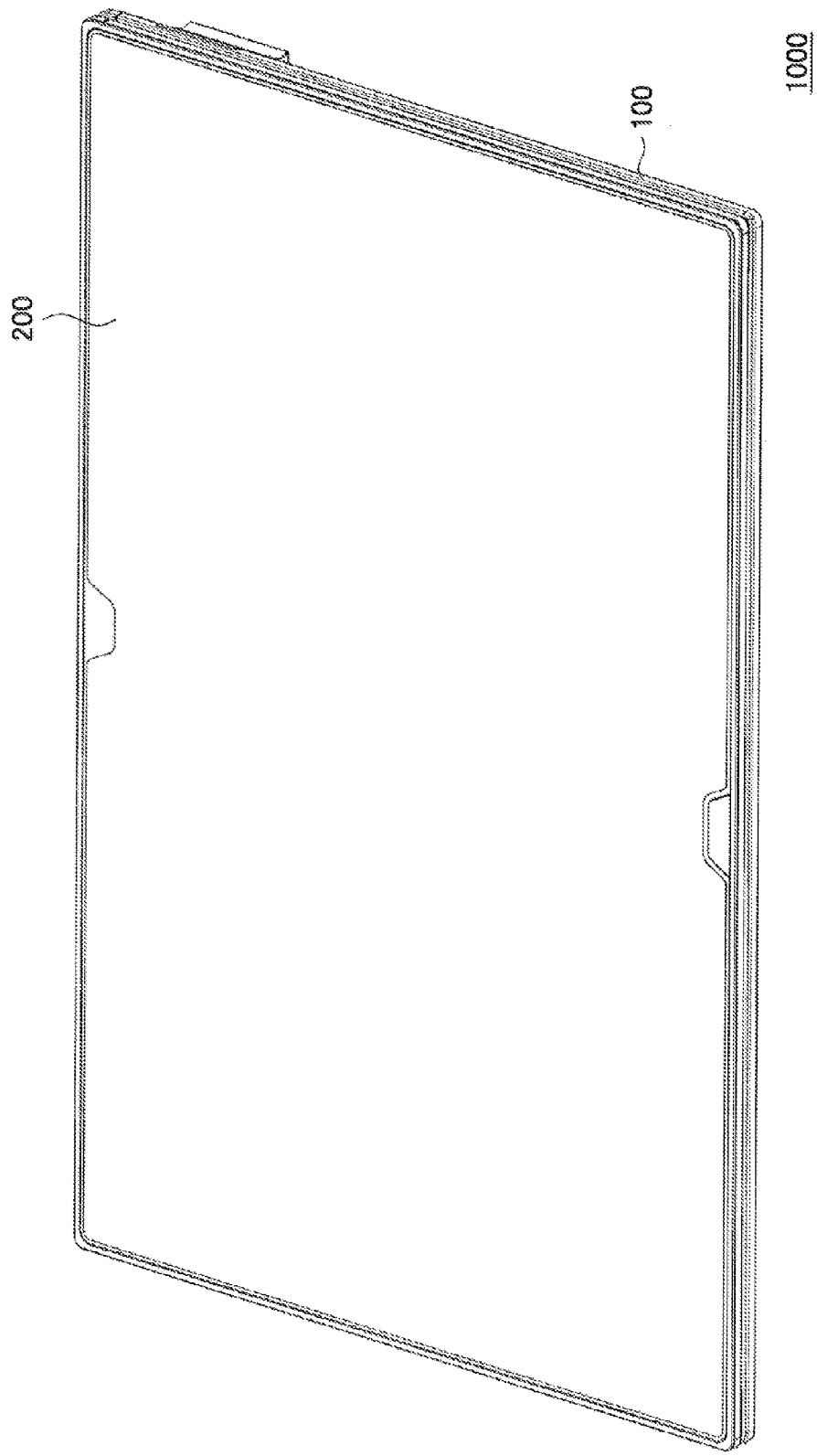
FIG. 1 is a schematic diagram illustrating a state in which a display unit overlaps a main unit.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

1. Information processing apparatus appearance example
2. Link mechanism of main unit, display unit, and hinge
3. Utilization of the space provided between display unit and main unit
4. Configuration for tilting display unit with respect to main unit
5. Latch mechanism for engaging display unit with main unit (1. Information Processing Apparatus Appearance Example)

Figure 2:
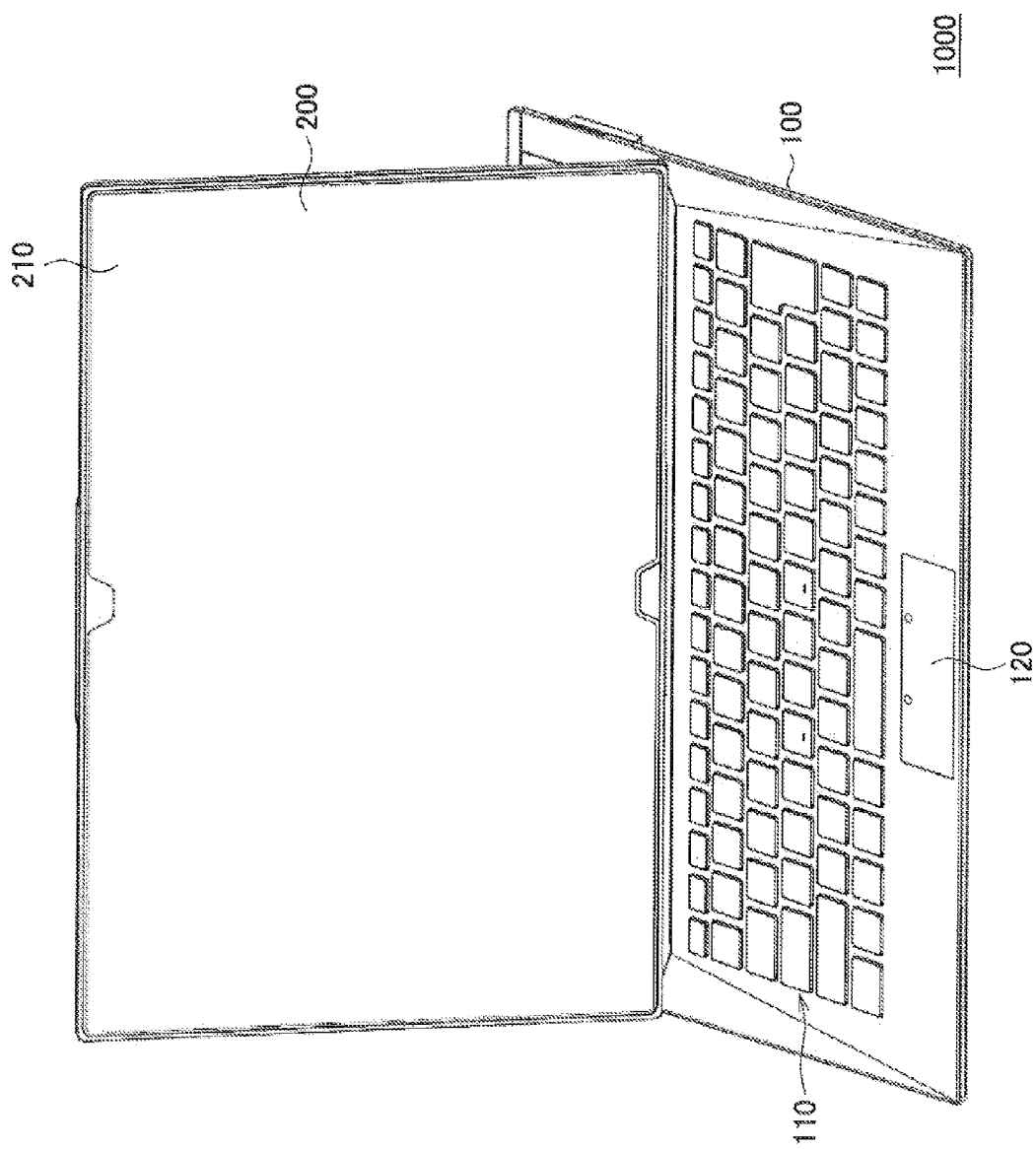
FIG. 2 is a schematic diagram illustrating a state in which the display unit has been slid up and is erect with respect to the main unit.
Figure 3:
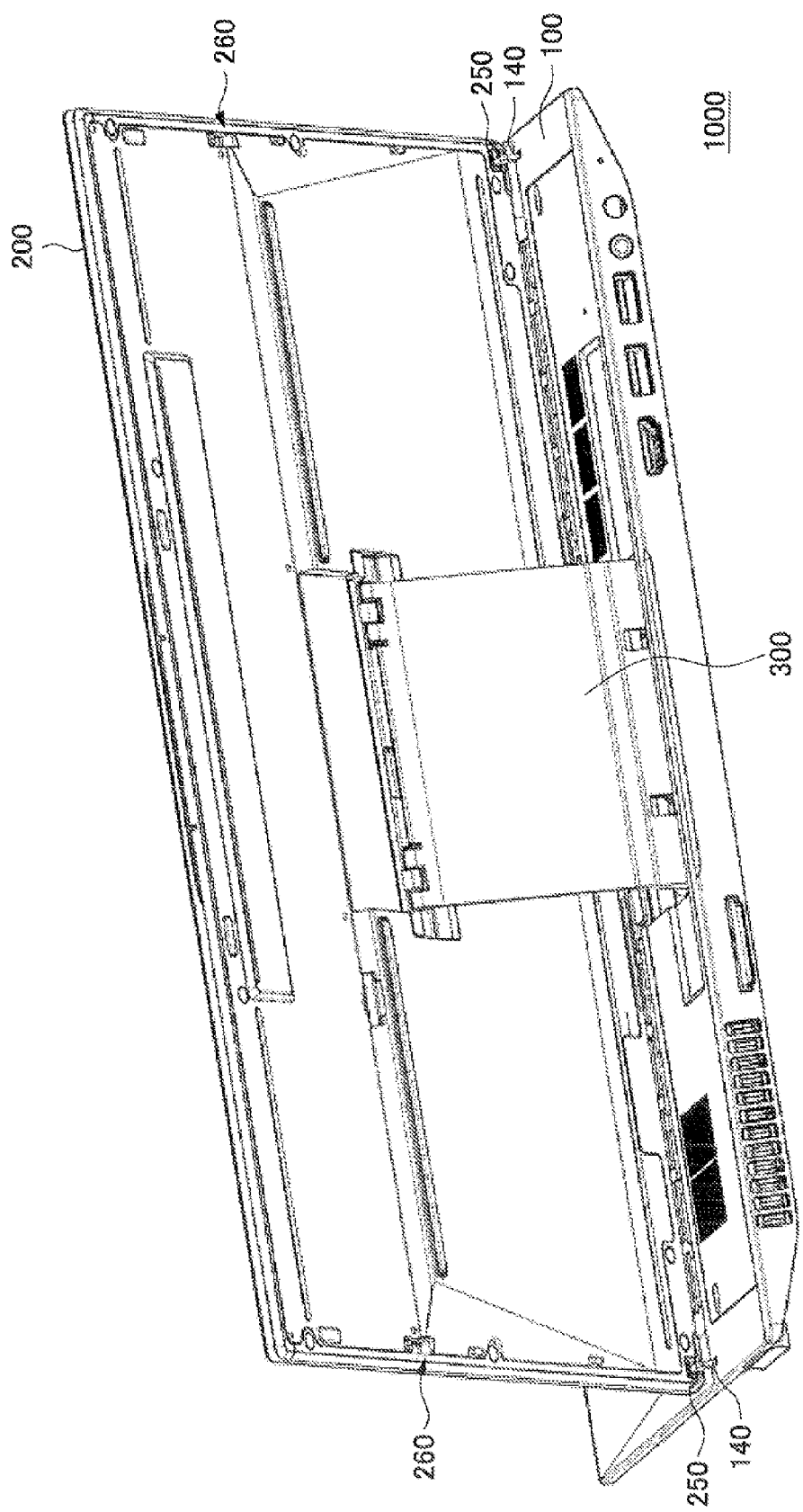
FIG. 3 is a schematic diagram illustrating a state in which the state illustrated in FIG. 2 is viewed from a back face of an information processing apparatus.

First, a schematic configuration of an information processing apparatus according to a first embodiment of the present disclosure will be described with reference to FIGS. 1 to 3. FIGS. 1 to 3 are schematic diagrams illustrating the appearance of an information processing apparatus (electronic device) 1000. The information processing apparatus 1000 has a main unit 100 and a display unit 200. A keyboard 110 is provided on the main unit 100. The display unit 200 includes a touch panel 210 that is provided with a touch sensor on a display device such as a LCD.

FIG. 1 illustrates a state in which the display unit 200 overlaps the display unit 200. In this state, the user can perform a desired operation by operating the touch panel 210. Namely, the user can use the information processing apparatus 1000 as a so-called tablet terminal.

On the other hand, FIG. 2 illustrates a state in which the display unit 200 has been slid up and is erect with respect to the main unit 100. In this state, the user can perform a desired operation by operating the keyboard 110. Further, the user can also perform a desired operation by operating the touch panel 210 on the display unit 200. In addition, the user can also perform a desired operation by operating a touch pad 120, which is a pointing device provided on an area in front of the keyboard 110.

FIG. 3 illustrates a state in which the state illustrated in FIG. 2 is viewed from a back face of the information processing apparatus 1000. As illustrated in FIG. 3, the main unit 100 and the display unit 200 are connected via a hinge 300. The information processing apparatus 1000 can move between the state illustrated in FIG. 1 and the state illustrated in FIG. 2 by sliding the display unit 200 with respect to the main unit 100 via the hinge 300 (hereinafter also referred to as "surface-sliding").

Figure 4:
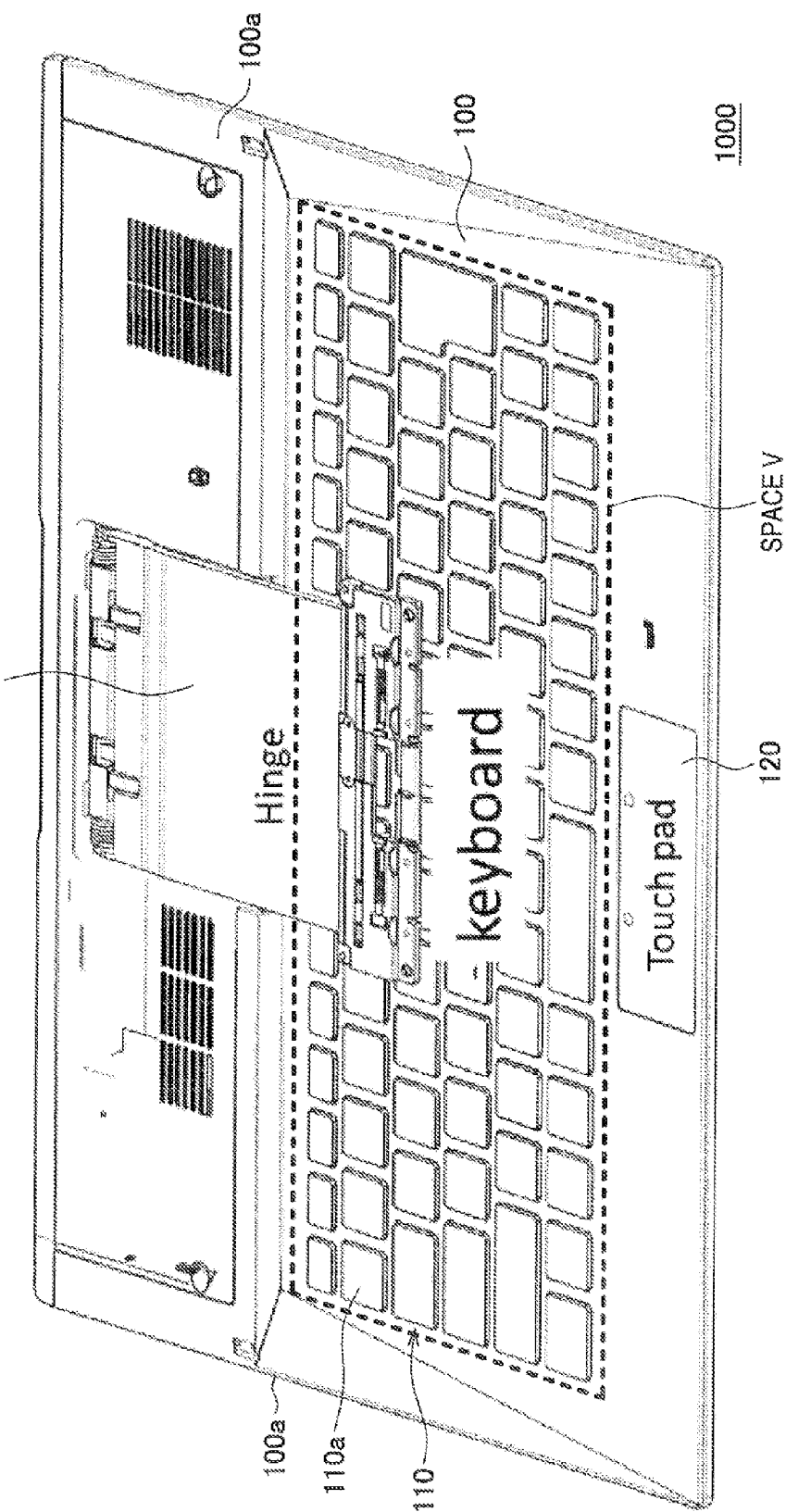
FIG. 4 is a perspective diagram illustrating a state in which the display unit has been removed from the state illustrated in FIG. 1.

FIG. 4 is a perspective diagram illustrating a state in which the display unit 200 has been removed from the state illustrated in FIG. 1. As illustrated in FIG. 1, in the state illustrated in FIG. 1, in which the display unit 200 overlaps the main unit 100, a part of the near side of the hinge 300 overlaps the keyboard 110. In other words, the hinge 300 is provided extending toward a front side until it overlaps the keyboard 110 to ensure that the length of the hinge 300 in the front-rear direction is sufficiently long. Based on such a configuration, in a state in which the display unit 200 is open (FIG. 2), since the display unit 200 can be moved further back with respect to the main unit 100, the tilt angle of the display unit 200 can be increased.

(2. Link Mechanism of Main Unit, Display Unit, and Hinge)

Figure 5:
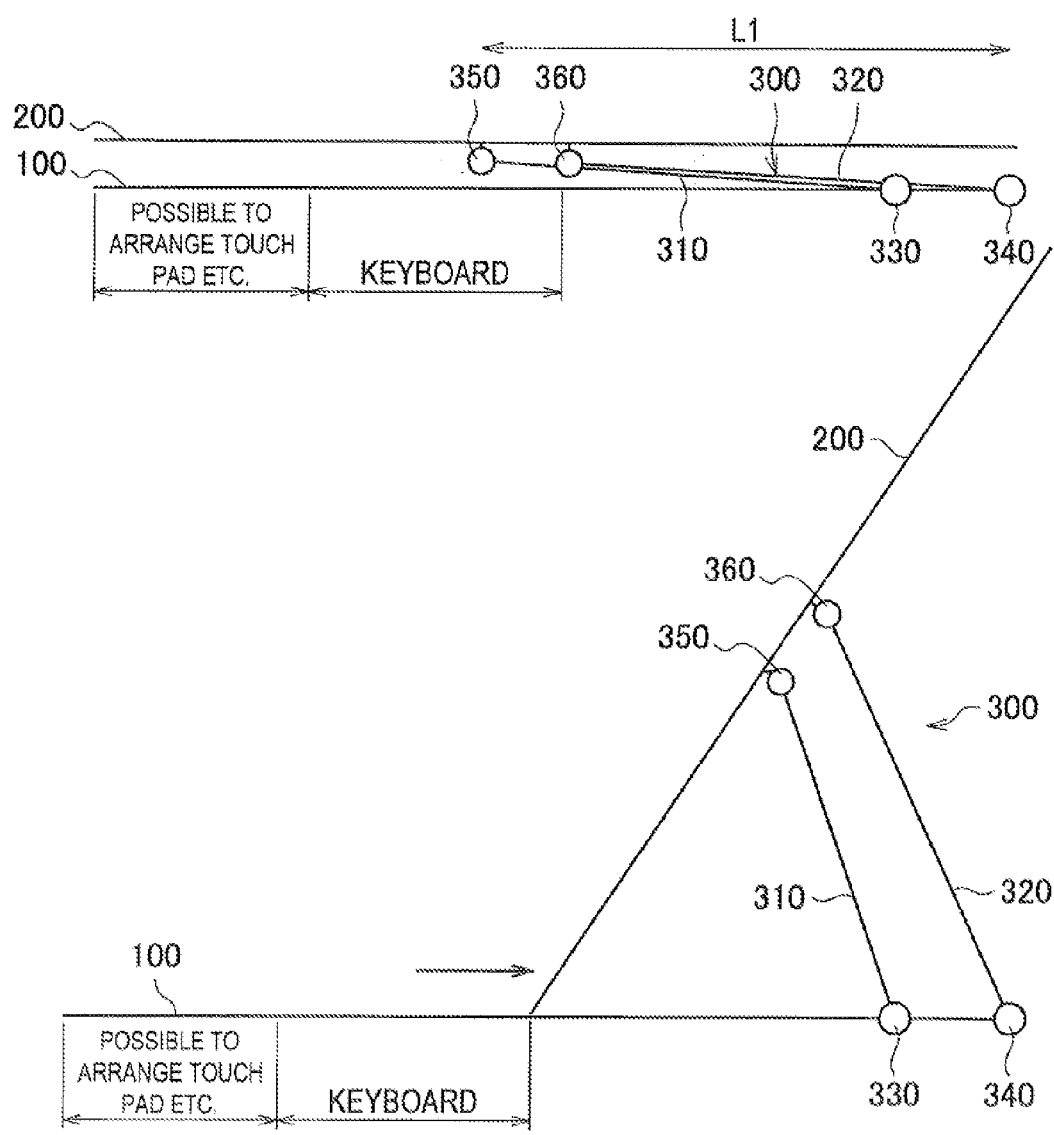
FIG. 5 is a schematic diagram illustrating a link mechanism of the main unit, the display unit, and a hinge.

FIG. 5 is a schematic diagram illustrating a link mechanism of the main unit 100, the display unit 200, and the hinge 300. The upper section of FIG. 5 schematically illustrates the state illustrated in FIG. 1, and the lower section schematically illustrates the state illustrated in FIG. 2. In the example illustrated in FIG. 5, a length L1 of the hinge 300 is long, so that the hinge 300 and the keyboard 110 overlap. As illustrated in FIG. 5, the hinge 300 is configured from two hinge plates 310 and 320. The main unit 100 and the display unit 200 are connected via two links (joints) 330 and 340. Further, the main unit 100 and the display unit 200 are connected via two links (joints) 350 and 360. Based on such a configuration, when the display unit 200 is slid to the rear side of the main unit 100, the display unit 200 can be tilted with respect to the main unit 100.

Figure 6:
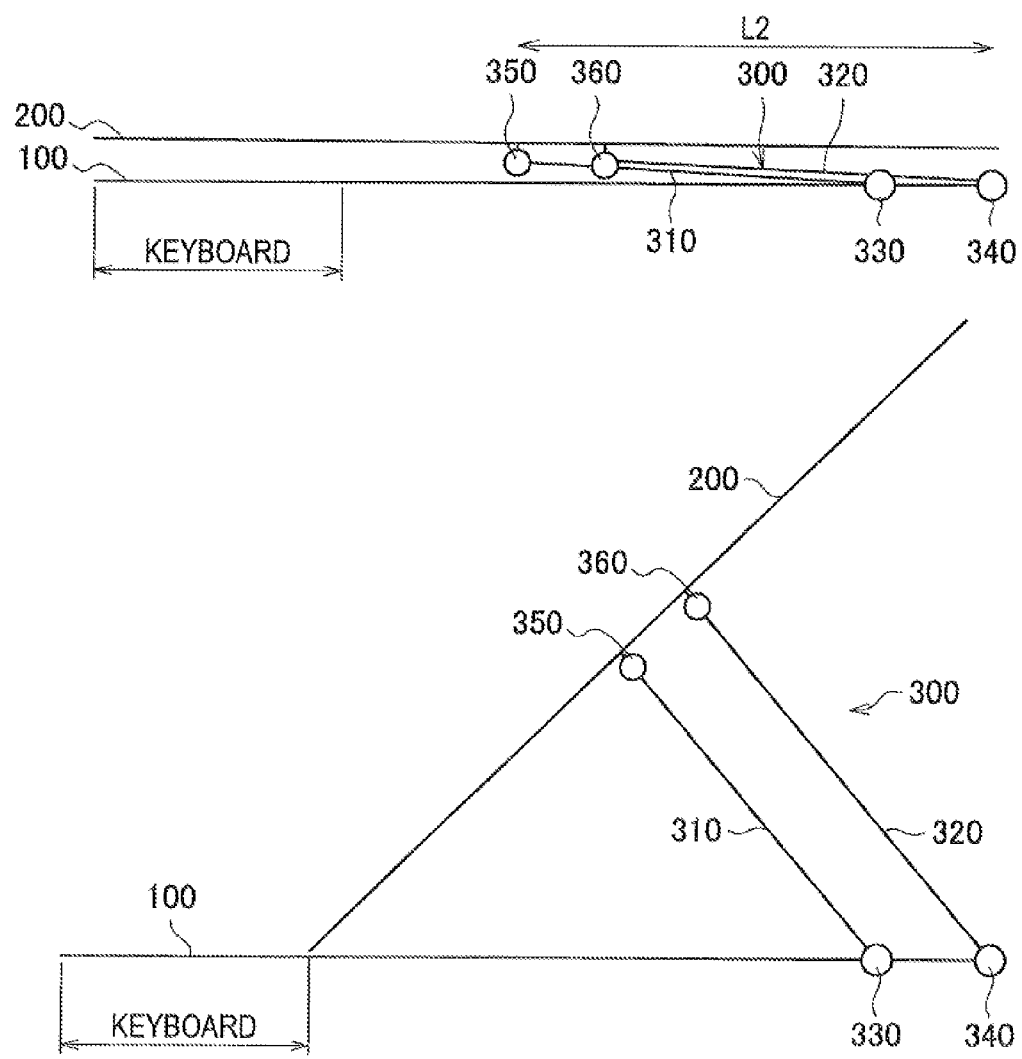
FIG. 6 is a schematic diagram illustrating an example in which the hinge does not overlap a keyboard for the purpose of a comparison with FIG. 5.

For the purpose of a comparison with FIG. 5, FIG. 6 illustrates an example in which a length L2 of the display unit 200 is shorter than the length L1 of the display unit 200 in FIG. 5, so that the hinge 300 does not overlap the keyboard 110. In this case, when the display unit 200 is tilted, since the length L2 of the hinge is short, the tilt angle is smaller than in FIG. 5, so the display unit 200 faces upward. Consequently, the keyboard 110 is arranged toward the front of the main unit 100, which means that the size of the keyboard 110 is limited.

On the other hand, in the present embodiment illustrated in FIG. 5, by configuring so that the length L of the hinge is sufficiently long by making the hinge 300 overlap the keyboard 110, the tilt angle can be sufficient increased. Consequently, in the state illustrated in FIG. 2, the lower edge of the display unit 200 can be positioned further toward the back of the main unit 100, so that the keyboard 110 can be arranged further toward the back of the main unit 100. This enables constituent elements, such as a touch pad, a palm rest, and a NFC device, to be arranged in an area in front of the keyboard 110. Further, by increasing the tilt angle, the visibility of the display unit 200 can be increased when the user places the information processing apparatus 1000 on a desk and operates it in the state illustrated in FIG. 2.

Further, by configuring so that the hinge 300 overlaps the keyboard 110, the usage area of the keyboard 110 can be increased without the position of the keyboard 110 being restricted by the position of the hinge 300. Consequently, the key pitch can also be increased. In addition, by configuring so that the hinge 300 overlaps the keyboard 110, the usage area of the hinge 300 widens, so that the lower edge of the display unit 200 can be moved as far as the back of the main unit 100 when in the state illustrated in FIG. 2. Consequently, the tilt angle can be increased and the area of the keyboard 110 can be further widened. Moreover, this also enables the keyboard 110 to be arranged further to the rear of the main unit 100. Therefore, as illustrated in FIG. 2, the touch pad 120 can be arranged on the front side of the keyboard 110, and a NFC device, a palm rest and the like can also be arranged. On the other hand, as illustrated in FIG. 6, if the hinge 300 is configured so as to not overlap the keyboard 110, this means that the keyboard 110 is arranged further to the front of the main unit 100, which makes it difficult to ensure a space to provide the touch pad 120. Therefore, by configuring like in the present embodiment so that the hinge 300 overlaps the keyboard 110, a useful space can be ensured on the front side of the keyboard 110, so that a configuration having a greater added value can be obtained.

In addition, in the present embodiment, the hinge 300 is arranged at only one location in the center of the main unit 100. If, for example, the hinge 300 is arranged at two locations at either end of the main unit 100, a space for the hinges 300 would probably be provided at either end of the keyboard 110, meaning that the horizontal width of the main unit 100 would likely increase. Moreover, this may also mean that a concave portion, a groove or the like to avoid the hinges is provided on the main unit 100 at either end of the keyboard 110. Therefore, by arranging the hinge 300 at just one location in the center of the main unit 100, the information processing apparatus 1000 can be made as compact as possible, and the configuration of the information processing apparatus 1000 can be made simple so as to not harm the appearance.
(3. Utilization of the Space Provided Between Display Unit and Main Unit)

Figure 7:
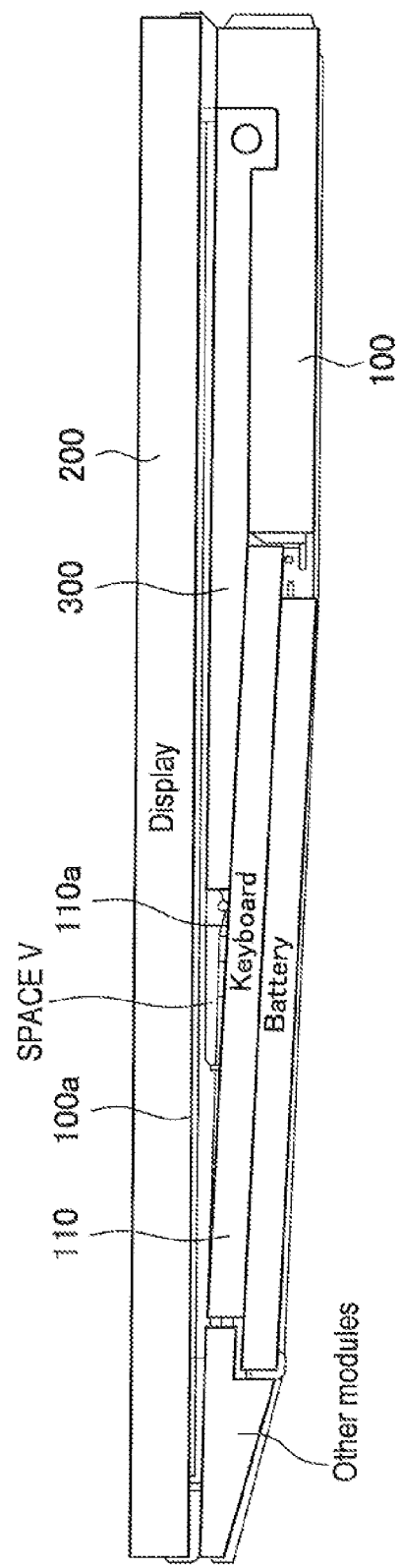
FIG. 7 is a schematic diagram illustrating a cross-section along a front-rear direction of the center of the information processing apparatus.

Next, the configuration in which the hinge 300 is housed between the main unit 100 and the display unit 200 in the state illustrated in FIG. 1 will be described. FIG. 7 is a schematic diagram illustrating a cross-section along a front-rear direction of the center of the information processing apparatus 1000. As illustrated in FIG. 7, an upper face 110a of the keyboard 110 is arranged at a predetermined angle with respect to an upper face 100a of the main unit 100. The upper face 100a of the main unit 100 and the upper face 110a of the keyboard 110 are not parallel. Consequently, as illustrated in FIG. 4, a step between the upper face 110a of the keyboard 110 and the upper face 100a of the main unit 100 becomes greater and greater heading toward the back of the main unit 100. Based on such a configuration, a predetermined space V is formed between the display unit 200 and the keyboard 110. In the state illustrated in FIG. 1, the hinge 300 is arranged in this space V. Therefore, the hinge 300 can be housed in the space V without being interfered with by the keyboard 110 or the display unit 200.

Figure 8:
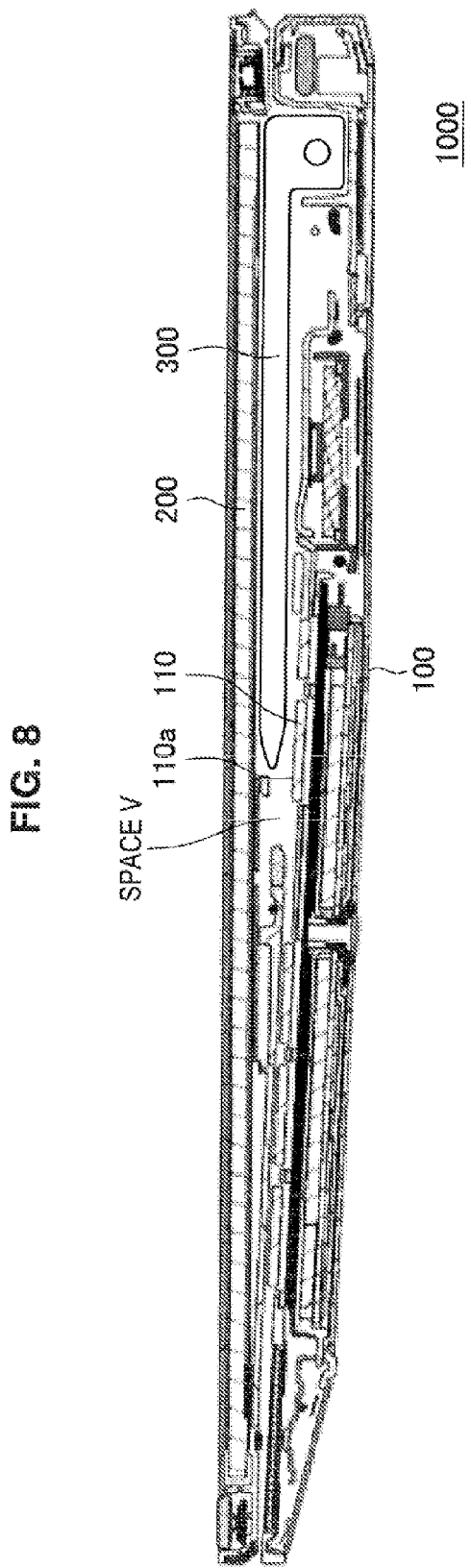
FIG. 8 is a cross-sectional view illustrating FIG. 7 in more detail.

FIG. 8 is a cross-sectional view illustrating FIG. 7 in more detail. As illustrated in FIG. 8, the hinge 300 is arranged in the space V between the keyboard 110 and the display unit 200.

Figure 9:
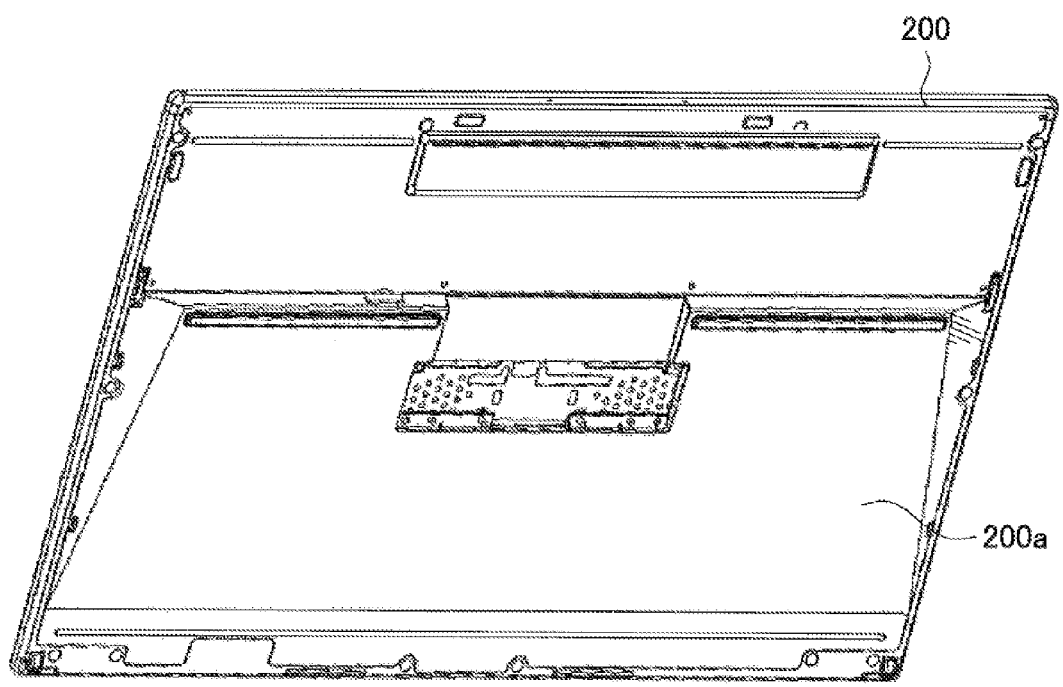
FIG. 9 is a schematic diagram illustrating a convex-shaped area provided on a rear side of the display unit.

Further, since the hinge 300 is provided at only one location in the center of the main unit 100, the space V exists also on either side of the hinge 300. In the present embodiment, a bulge (convex-shaped area) 200a that protrudes toward the keyboard 110 is provided on the rear side of the display unit 200 so as to take up the space V on either side of the hinge 300. FIG. 9 is a schematic diagram illustrating a convex-shaped area 200a provided on the rear side of the display unit 200. As illustrated in FIG. 9, the bulge 200a is provided to the left and right of the center of the display unit 200. The bulge 200a is formed so that the thickness of the display unit 200 becomes thicker heading further back beyond the main unit 100 in the state illustrated in FIG. 1 to match the shape of the space V formed between the display unit 200 and the main unit 100.

Figure 10:
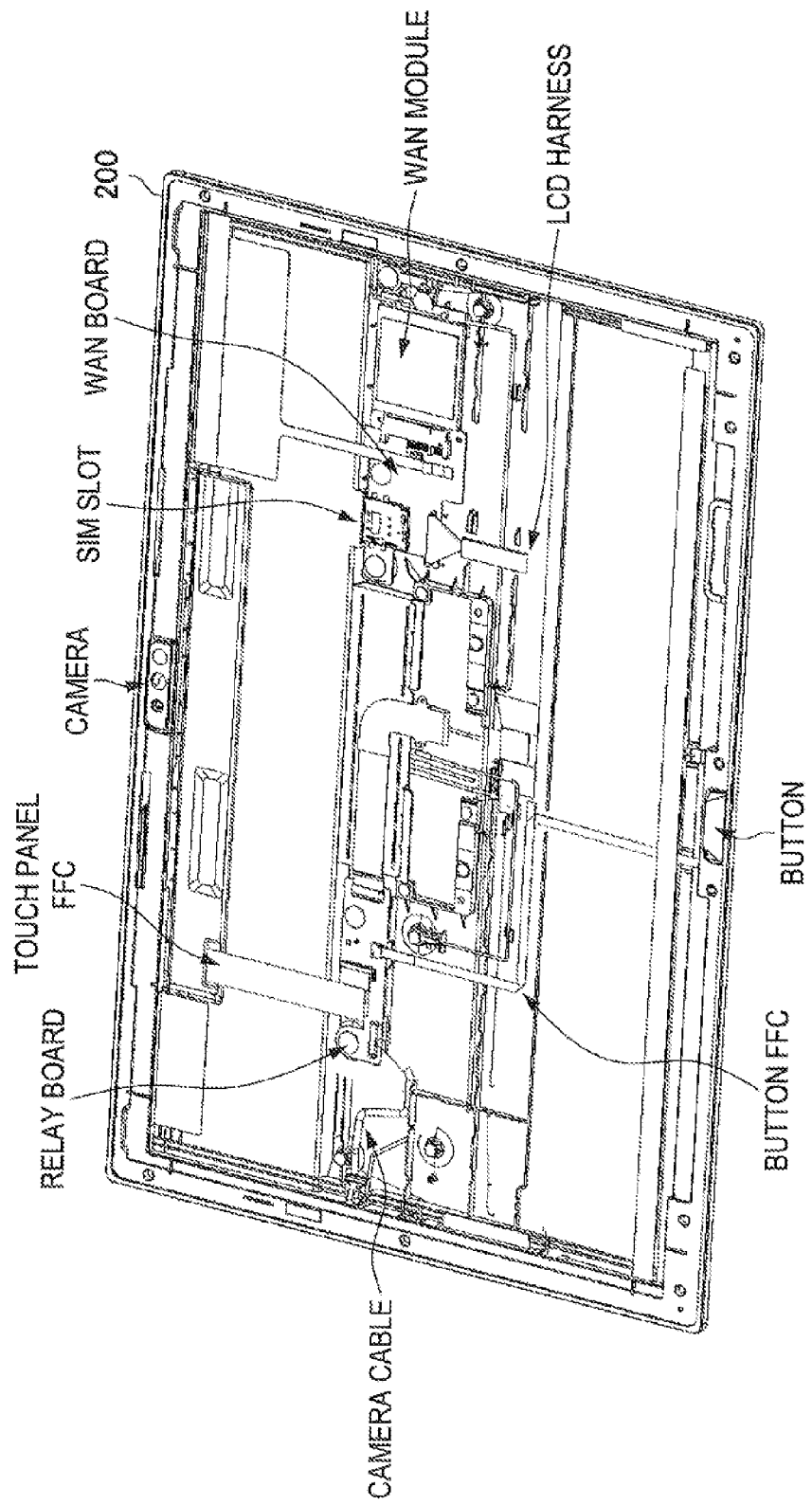
FIG. 10 is a schematic diagram illustrating an internal configuration of the display unit.

Based on this configuration, various modules can be arranged on the convex-shaped area 200a of the display unit 200. FIG. 10 is a schematic diagram illustrating an internal configuration of the display unit 200. For example, a relay board 220 that combines three types of signal line into one from a touch panel board, a camera module, and a button board may be arranged on one convex-shaped area 200a. Further, on another convex-shaped area 200a, a board mounted with a WAN module and a SIM slot may be arranged. In addition, the convex-shaped area 200a can also be utilized without leaving any space by arranging an LCD harness, an antenna cable and the like on the convex-shaped area 200a.

Further, other modules, such as a speaker and a battery, may also be arranged on the convex-shaped area 200a. If a speaker is arranged on the convex-shaped area 200a, since a very large space can be used compared with the space on the main unit 100 side, a high audio quality speaker can be arranged. Compared with when arranged on the main unit 100, sound can be transmitted from a higher position, so that audio quality can be increased. Further, if a battery is arranged on the convex-shaped area 200a, the battery capacity can be increased.

Generally, modules that are noise generation sources, such as a motherboard, are arranged on the main unit 100. Consequently, it is desirable to arrange communication system modules, antennas and the like that are susceptible to the effects of noise on the convex-shaped area 200a of the display unit 200. This enables the effects of noise from the main unit 100 to be suppressed. If arranging an antenna, the antenna can also be effectively employed as a countermeasure against SAR. Further, a NFC (near field communication) device may also be mounted on the convex-shaped area 200*a*.

Figure 11:
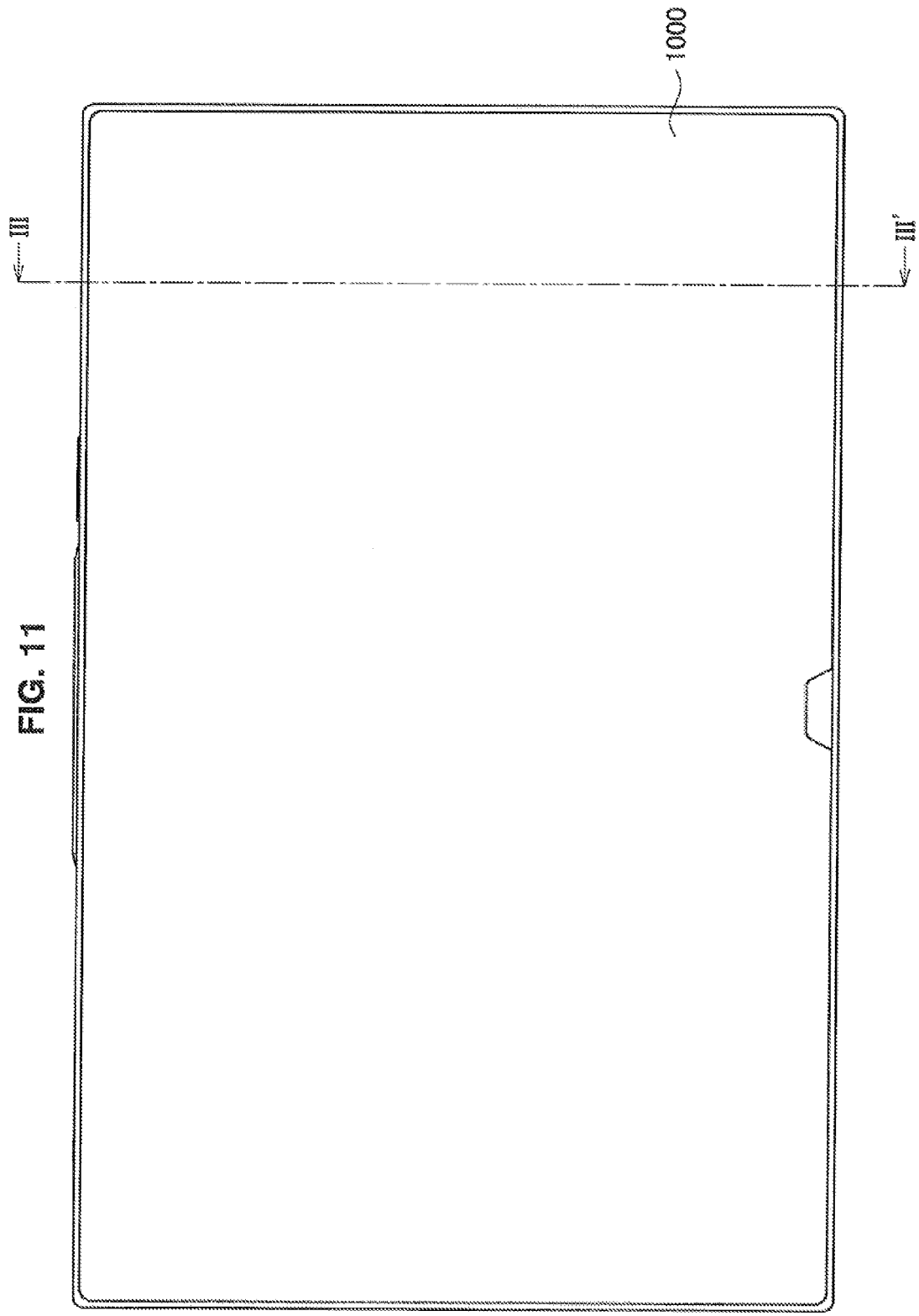
FIG. 11 is a schematic diagram illustrating an example in which a module is arranged on the convex-shaped area.
Figure 12:
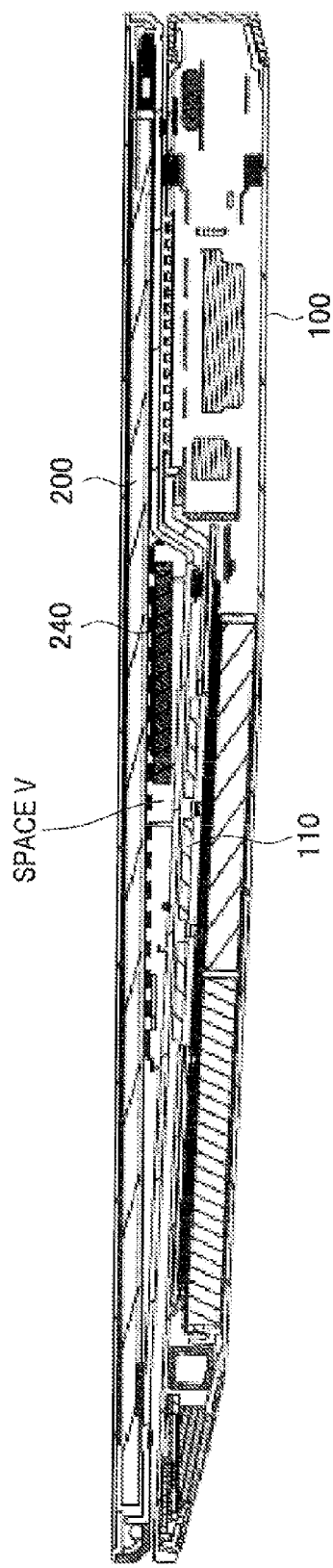
FIG. 12 is a schematic diagram illustrating an example in which a module is arranged on the convex-shaped area.

FIGS. 11 and 12 are schematic diagrams illustrating examples in which a module is arranged on the convex-shaped area 200*a*. FIG. 11 illustrates the state of FIG. 1 as viewed from above. Further, FIG. 12 illustrates a cross-section along the dashed line III-III' in FIG. 11, in which a cross-section further to the right side then the hinge 300 is shown. As illustrated in FIG. 12, a WAN board 240 is arranged as a module on the convex-shaped area 200*a* on the right side of the display unit 200. Other modules can also be similarly arranged. Since the vertical width of the space V increases heading toward the back of the information processing apparatus 1000, it is preferred to arrange modules that are comparatively thick at the far side of the information processing apparatus 1000, and modules that are comparatively thin at the near side of the information processing apparatus 1000.

Thus, by arranging the upper face 110*a* of the keyboard 110 at an angle with respect to the upper face 100*a* of the main unit 100, a space can be provided between the keyboard 110 and the display unit 200, and the hinge 300 can be arranged overlapping the keyboard 110. Further, by providing a space between the keyboard 110 and the display unit 200, the convex-shaped area 200*a* can be provided on either side of the hinge 300. Therefore, the information processing apparatus 1000 can be made as small as possible by effectively utilizing this space by arranging modules on the convex-shaped area 200*a*. These modules can be arranged without increasing the overall thickness of the information processing apparatus 1000. By arranging modules that would normally be arranged on the main unit 100 on the display unit 200 side, wasted space can be eliminated, and the information processing apparatus 1000 can be made more compact and lighter.

(4. Configuration for Tilting Display Unit with Respect to Main Unit)

Figure 13:
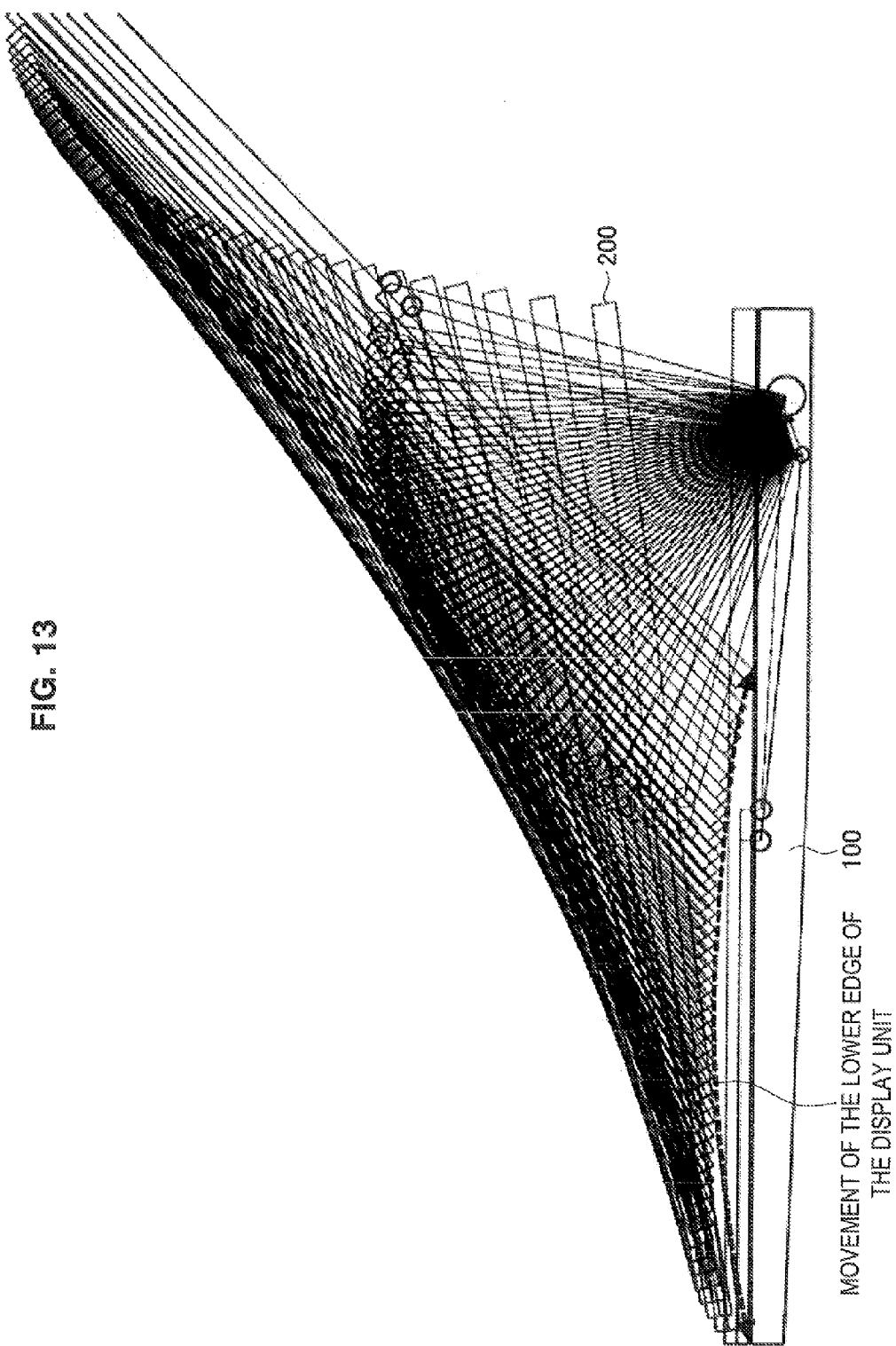
FIG. 13 is a diagram illustrating the display unit tilted with respect to the main unit.

Next, a configuration for tilting the display unit 200 with respect to the main unit 100 from the state illustrated in FIG. 1 to the state illustrated in FIG. 2 will be described. FIG. 13 is a schematic diagram illustrating the display unit 200 tilted with respect to the main unit 100, which shows a state as viewed from the right side of the information processing apparatus 1000. Further, FIG. 14 is a diagram illustrating the display unit 200 tilted with respect to the main unit 100, which shows the position of the display unit 200 shifted in the horizontal direction so as not to overlap the display unit 200.

Figure 14:
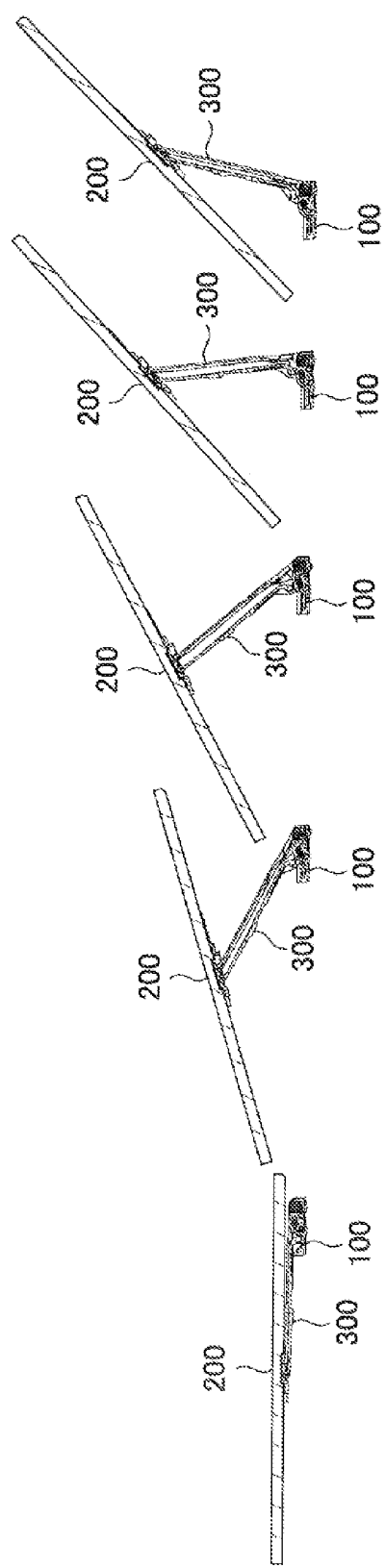
FIG. 14 is a diagram illustrating the display unit tilted with respect to the main unit.

As illustrated in FIGS. 13 and 14, in the present embodiment, when the display unit 200 is tilted from the state illustrated in FIG. 1 to the state illustrated in FIG. 2, the display unit 200 moves across the upper face of the main unit 100. More specifically, the lower edge of the display unit 200 moves across the upper face of the main unit 100. Further, while between the state illustrated in FIG. 1 and the state illustrated in FIG. 2, the lower edge of the display unit 200 moves so as to rise above the upper face of the main unit 100. Consequently, when tilting the display unit 200, since the display unit 200 follows a smooth track above the main unit 100, a graceful movement can be realized. Further, when moving from the state illustrated in FIG. 1 to the state illustrated in FIG. 2, since the display unit 200 becomes parallel to the main unit 100 at a comparatively early stage, a graceful surface-slide can also be realized.

Figure 15:
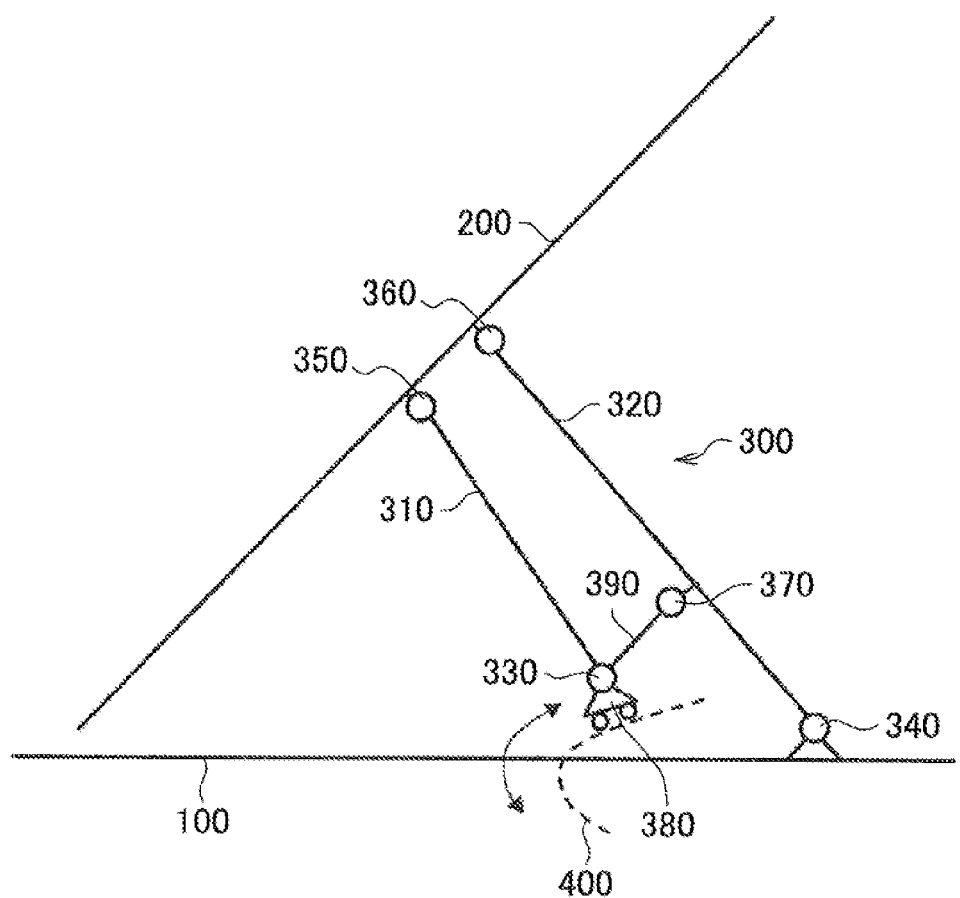
FIG. 15 is a schematic diagram illustrating a link mechanism of the main unit, the display unit, and the hinge for the purpose of realizing the movements illustrated in FIGS. 13 and 14.

To realize this movement, in the present embodiment, one of the links of the hinge 300 is moved along a curve. FIG. 15 is a schematic diagram illustrating a link mechanism of the main unit 100, the display unit 200, and the hinge 300 for the purpose of realizing the movements illustrated in FIGS. 13 and 14. The mechanism illustrated in FIG. 15 adds a hinge plate 390 and a link (joint) 370 to the mechanism of FIG. 5. By providing the link 370, the degree of freedom of the display unit 200 is decreased by one degree, so that a change in the tilt angle of the display unit 200 when the angle of the hinge 300 is fixed can be suppressed. As a result and as an example, hinge plate 310 may be considered a first hinge member, hinge plate 320 may be considered a second hinge member, hinge plate 390 may be considered a third hinge member, link (joint) 330 may be considered a first joint, link (joint) 350 may be considered a second joint, link (joint) 340 may be considered a third joint, link (joint) 360 may be considered a fourth joint, and link (joint) 370 may be considered a fifth joint.

Further, with the mechanism illustrated in FIG. 15, a slider 380 is provided on the link 330, so that when the display unit 200 is tilted from the state illustrated in FIG. 1 to the state illustrated in FIG. 2, the slider 380 moves along a predetermined curve. Specifically, the slider 380 is inserted into a curved cam 400, and moves along the curved cam 400. The trajectory that the display unit 200 follows during an open/close operation can be arbitrary set by arbitrarily setting the shape of the curved cam 400. Therefore, the above-described movement of the lower edge of the display unit 200 across the upper face of the main unit 100 can be realized by optimally setting the shape of the curved cam 400. Further, by optimally setting the shape of the curved cam 400, the display unit 200 can be reliably prevented from interfering with the keyboard 110. In addition, as illustrated in FIG. 13, this also enables fine adjustments to movement to be made, such that the lower edge of the display unit 200 moves in a convex shape above the upper face of the main unit 100 during the tilt process. Therefore, by configuring so that the slider 380 moves along a curve, a desired tilt operation of the display unit 200 can be realized.

Figure 16:
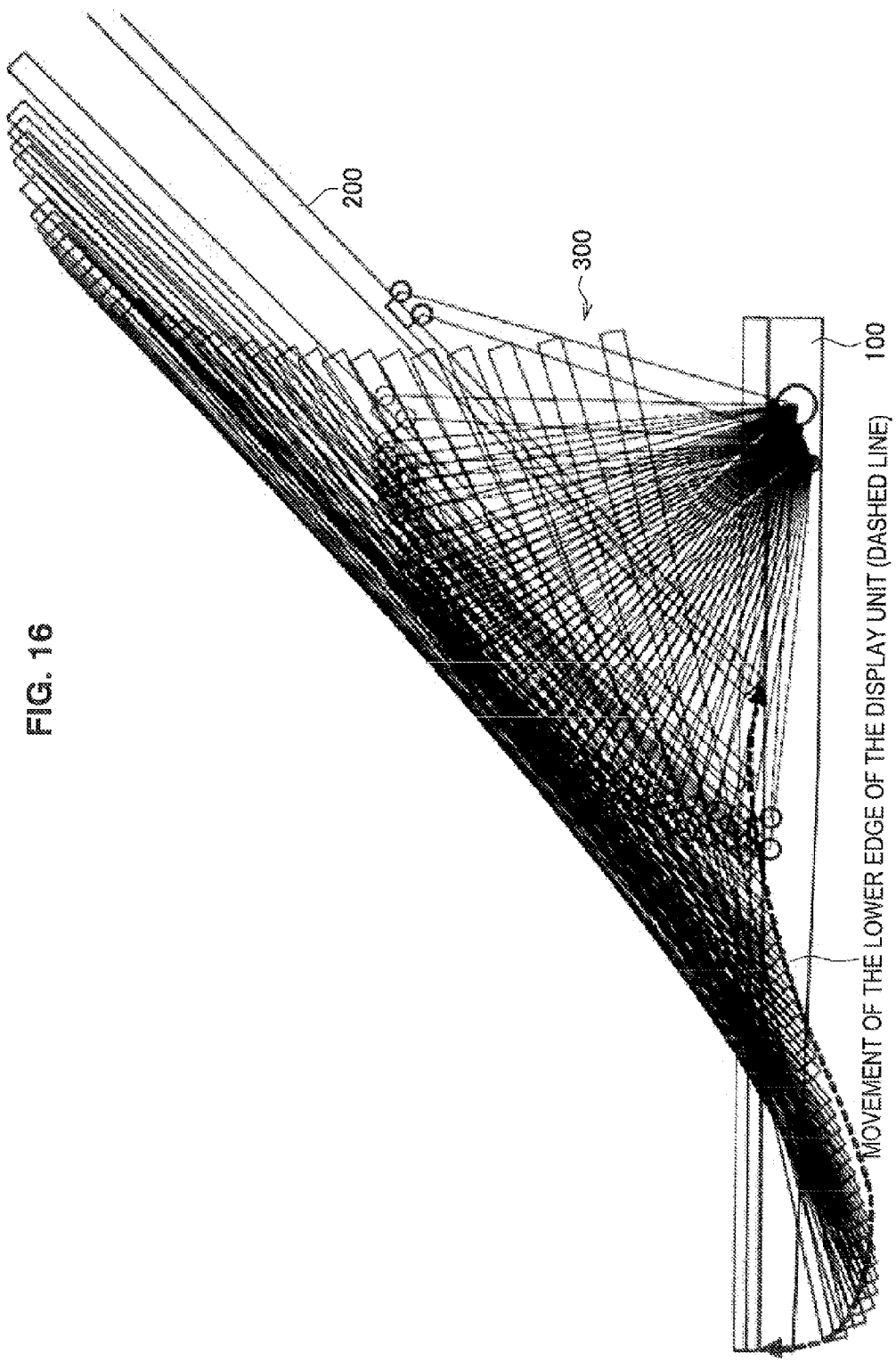
FIG. 16 is a schematic diagram illustrating a case in which a slider moves linearly in a horizontal direction.
Figure 17:
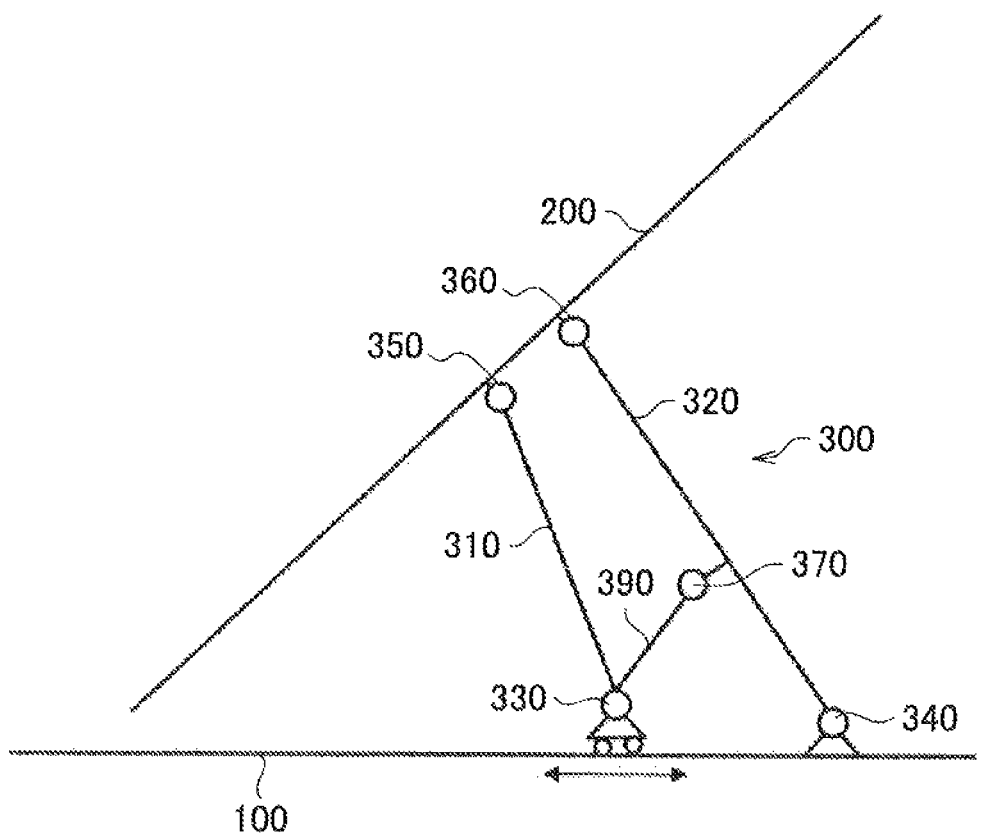
FIG. 17 is a schematic diagram illustrating a case in which a slider moves linearly in a horizontal direction.

On the other hand, for the purpose of comparison, FIGS. 16 and 17 illustrate cases in which the slider 380 moves linearly in a horizontal direction. In this case, as the display unit 200 moves from the state illustrated in FIG. 2 to the state illustrated in FIG. 1, the lower edge of the display unit 200 is at a lower position than the upper face of the main unit 100, so that the display unit 200 and the main unit 100 interfere with each other. Therefore, when the slider 380 is configured so as to move linearly in a horizontal direction, movement of the display unit 200 like that illustrated in FIGS. 13 and 14 is not be realized.

Therefore, according to the present embodiment, since the slider 380 is configured so as to move along a curve, the movement of the display unit 200 can be provided with a degree of freedom, which enables a graceful movement to be realized in which the display unit 200 (display) smoothly tracks above the keyboard. Further, by configuring so that the slider 380 moves along a curve, interference with the keyboard 110 can be easily avoided, so that the degree of design freedom of the hinge 300 can also be increased.

Figure 18:
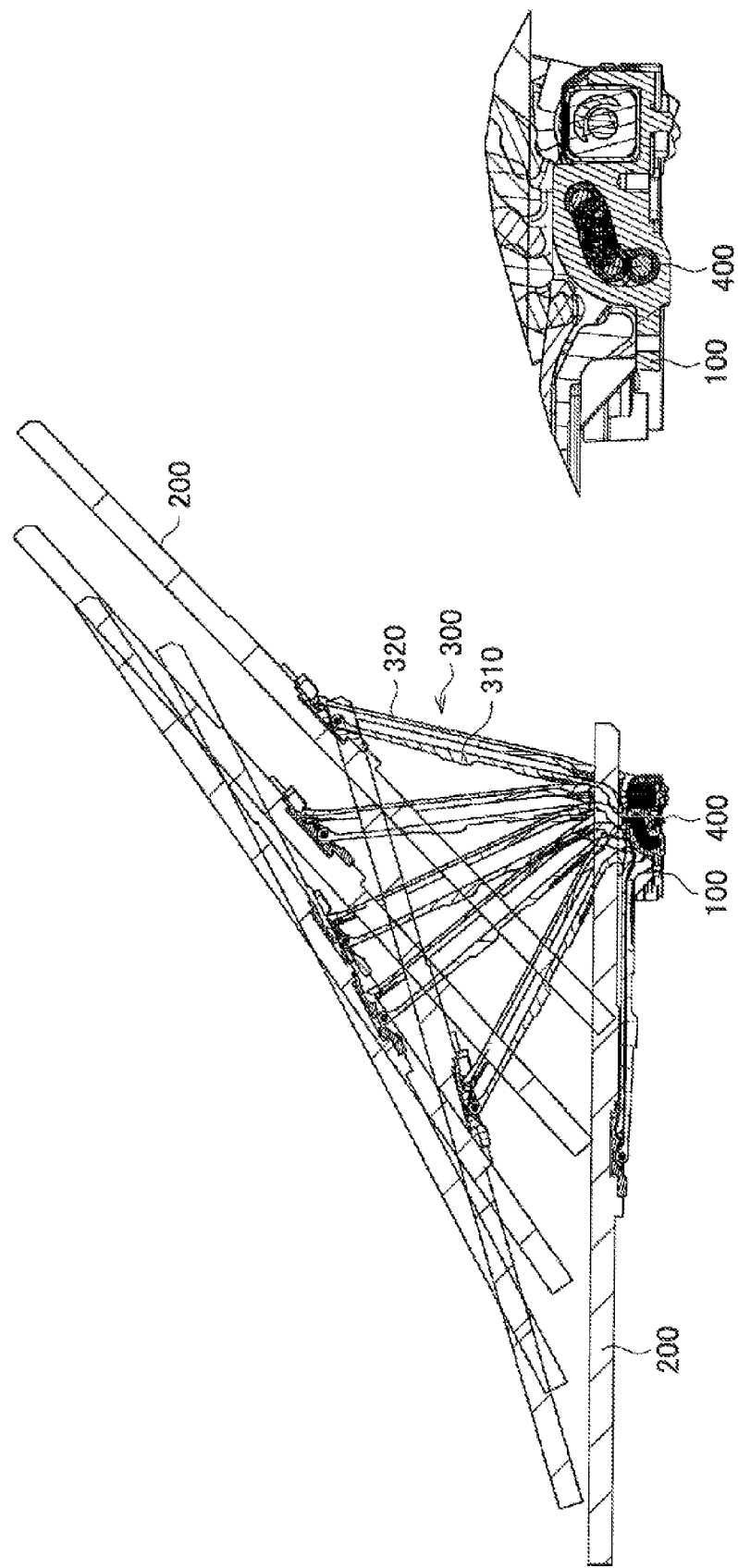
FIG. 18 is a schematic diagram illustrating movement of the display unit with respect to the main unit, and a specific shape of a curved cam.

FIGS. 18 and 19 are schematic diagrams illustrating a detailed configuration of the hinge 300 and the curved cam 400. FIG. 18 is a schematic diagram illustrating movement of the display unit 200 with respect to the main unit 100, and the specific shape of the curved cam 400. Similar to FIG. 13, the drawing on the left side of FIG. 18 illustrates only a part of the main unit 100. The drawing on the right side of FIG. 18 is an enlarged illustration of the curved cam 400 provided in the main unit 100.

FIG. 19 is a schematic diagram illustrating a detailed configuration of the hinge 300, in which the top drawing illustrates the hinge 300 as viewed from above in a state in which the display unit 200 overlaps the main unit 100 (FIG. 1) with the display unit 200 removed. Further, the bottom drawings in FIG. 19 illustrate cross-sections along the dashed lines I-I' and II-II' illustrated in the top drawing. As illustrated in FIG. 19, the link 330 also carries out the function of the slider 380 illustrated in FIG. 5, and can move along the curved cam 400. The link 330 extends from the position of the dashed line I-I' to the position of the dashed line II-II' in a direction orthogonal to each of the dashed lines. The link 370 is provided at a position on the dashed line I-I'. Thus, although in FIG. 15 all of the links were arranged in the same plane, the position of each link can be appropriately changed. In FIG. 19, the display unit 200 is mounted on an attachment plate 230.

Figure 20:
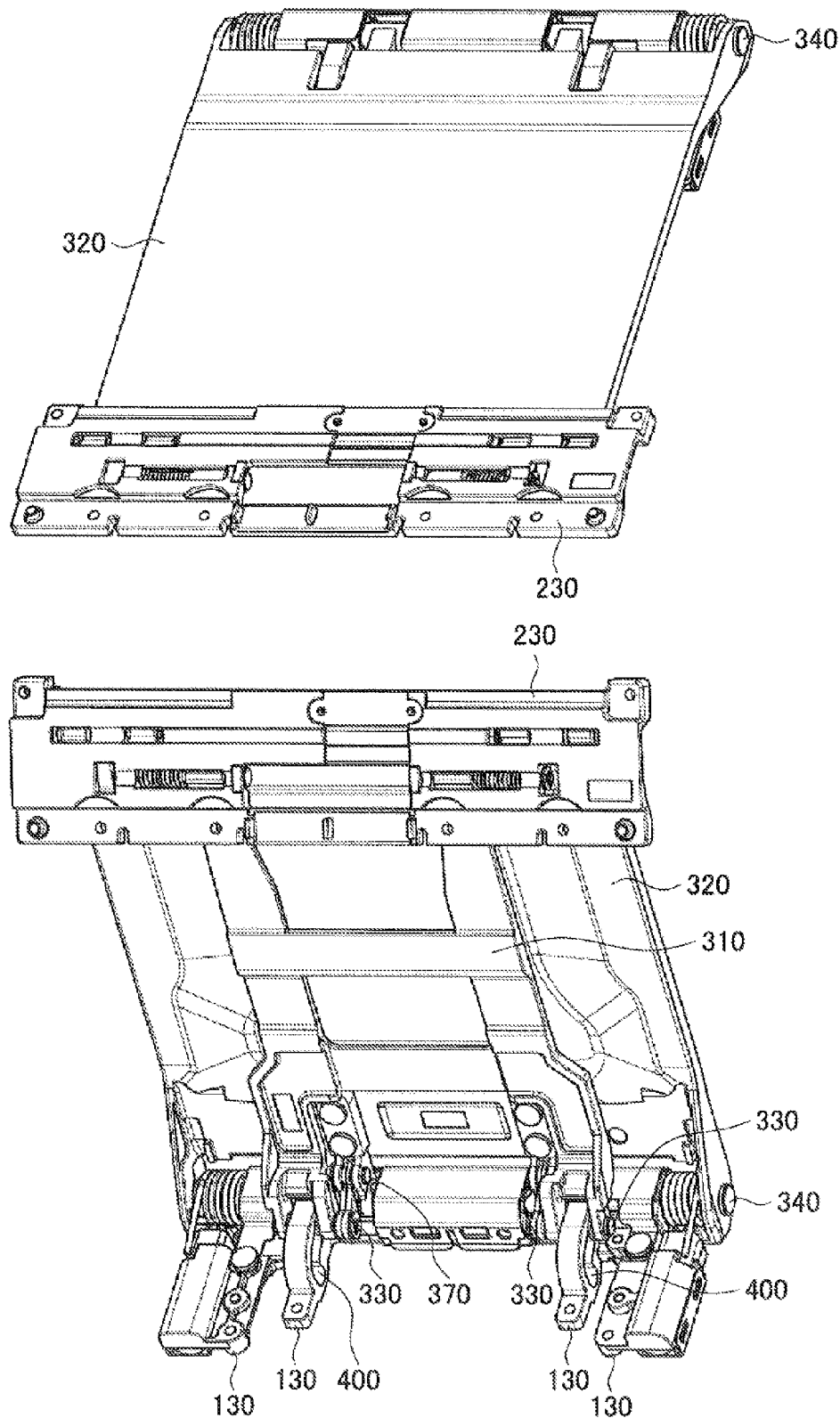
FIG. 20 is a schematic diagram illustrating a detailed configuration of the hinge.

FIG. 20 is a perspective diagram illustrating the configuration the hinge 300. The top drawing in FIG. 20 illustrates the hinge 300 as seen from above. Further, the bottom drawing in FIG. 20 illustrates the hinge 300 as seen from below (main unit side). In FIG. 20, an attachment member 130 is integrally fixed to the main unit 100.

Figure 21:
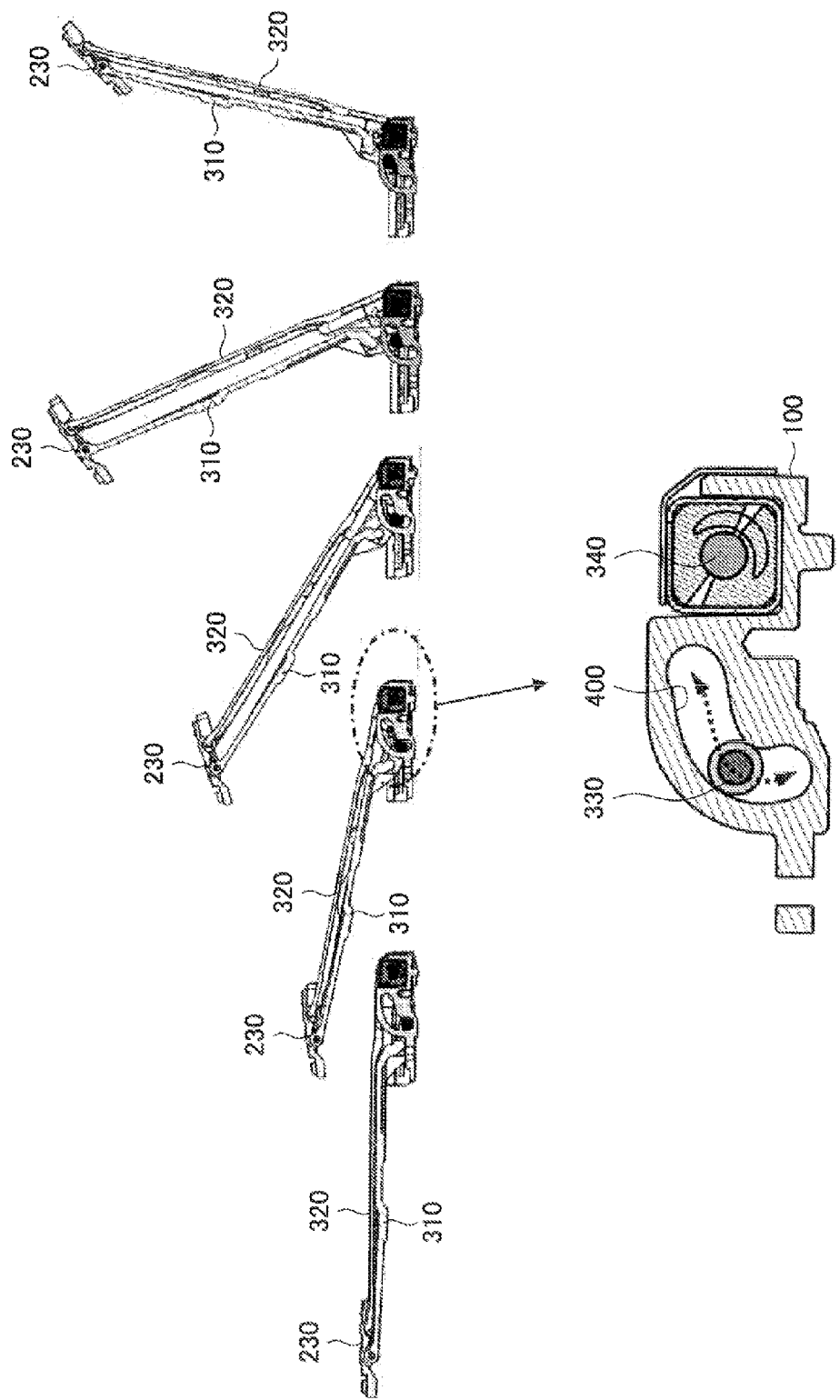
FIG. 21 is a schematic diagram illustrating turning of the hinge about the main unit.

FIG. 21 is a schematic diagram illustrating turning of the thus-configured hinge 300 about the main unit 100. When the hinge 300 turns about the main unit 100, the link 330 that also carries out the function of the slider 380 moves along the curved cam 400. Consequently, a graceful movement like that illustrated in FIG. 11 can be realized.

(5. Latch Mechanism for Engaging Display Unit with Main Unit)

Next, a latch mechanism that engages the display unit 200 with the main unit 100 when the display unit 200 is closed as illustrated in FIG. 1 and open as illustrated in FIG. 2 will be described. As illustrated in FIG. 3, a hook 140 is provided at either end on the left and right of the main unit 100. Further, latches 260 for engaging with the hooks 140 are provided on the display unit 200.

Figure 22:
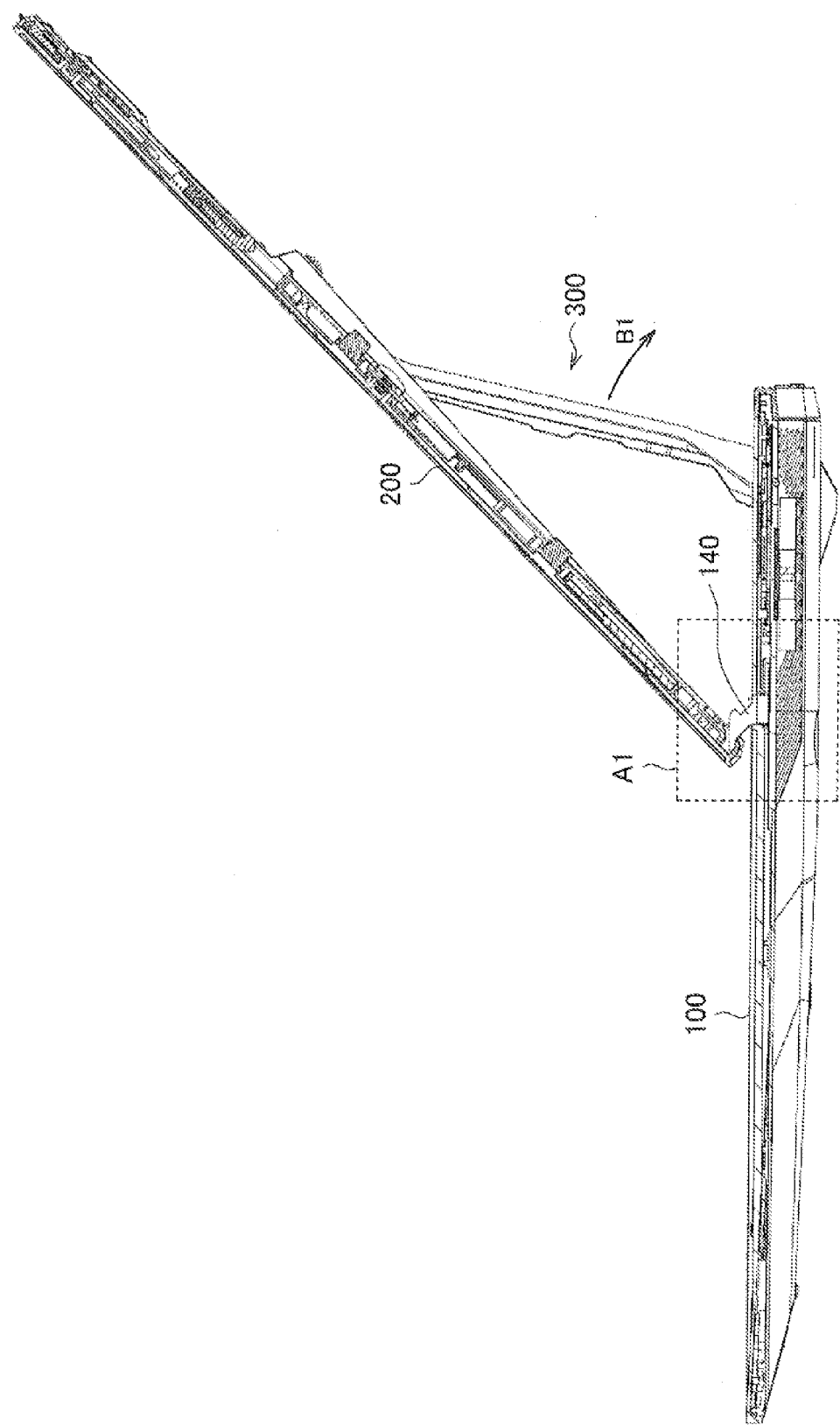
FIG. 22 is a schematic diagram illustrating a right side face of the information processing apparatus in the state illustrated in FIG. 2, which illustrates a cross-section along the front-rear direction at a position where a latch structure is provided.
Figure 23:
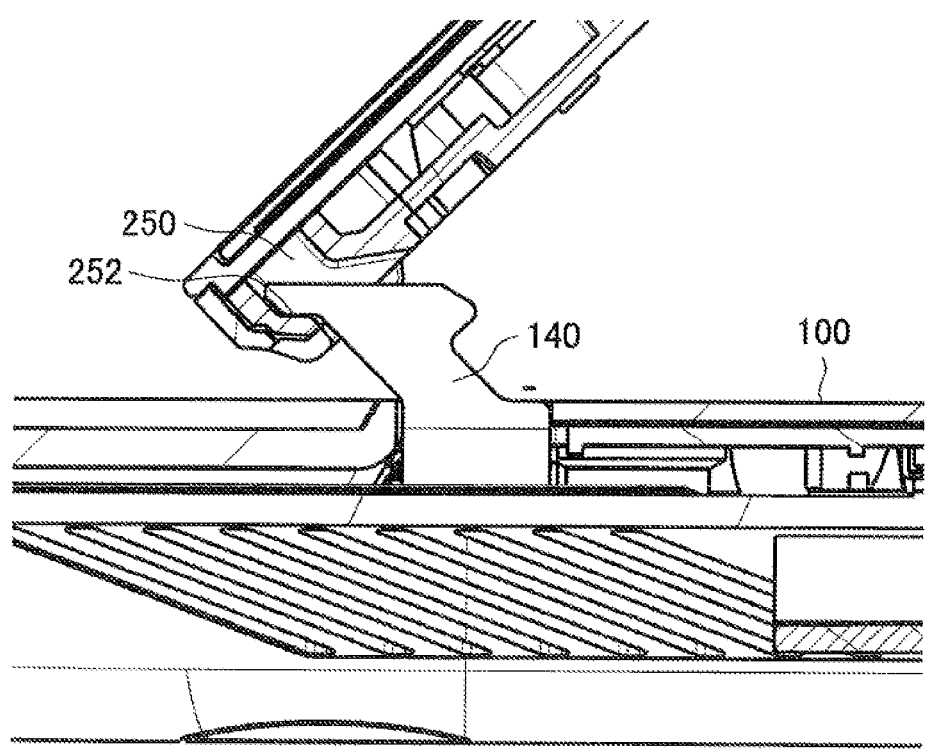
FIG. 23 is an enlarged cross-sectional view of area A1 illustrated in FIG. 22.

FIG. 22 is a schematic diagram illustrating a right side face of the information processing apparatus 1000 in the state illustrated in FIG. 2, which illustrates a cross-section along the front-rear direction at a position where a latch structure is provided. As illustrated in FIG. 22, a hook 140 is provided on the main unit 100. In the state illustrated in FIG. 2, the hook 140 engages with an engagement member 250 that is provided near a lower edge of the display unit 200. FIG. 23 is an enlarged cross-sectional view of the area A1 illustrated in FIG. 22. Thus, when the display unit 200 has been tilted with respect to the main unit 100, a portion 142 on a lower side of the tip of the hook 140 abuts an abutment face 252 of the engagement member 250 of the display unit 200. Here, in the state illustrated in FIG. 2, an urging force is applied by a spring (not illustrated) on the hinge 300 so that the hinge 300 turns in the direction of the arrow B1 in FIG. 22. Therefore, a state in which the portion 142 on a lower side of the hook 140 abuts the abutment face 252 of the engagement member 250 is maintained. Consequently, the display unit 200 can be fixed to the main unit 100 in the state illustrated in FIG. 2.

Further, in the state illustrated in FIG. 2, the shape of the curved cam 400 is set so that the position of the hook 140 and the engagement member 250 match. Therefore, when the display unit 200 has been tilted with respect to the main unit 100, the position of the hook 140 and the engagement member 250 will match, so that the portion 142 on a lower side of the hook 140 reliably abuts the abutment face 252 of the engagement member 250.

Figure 24:
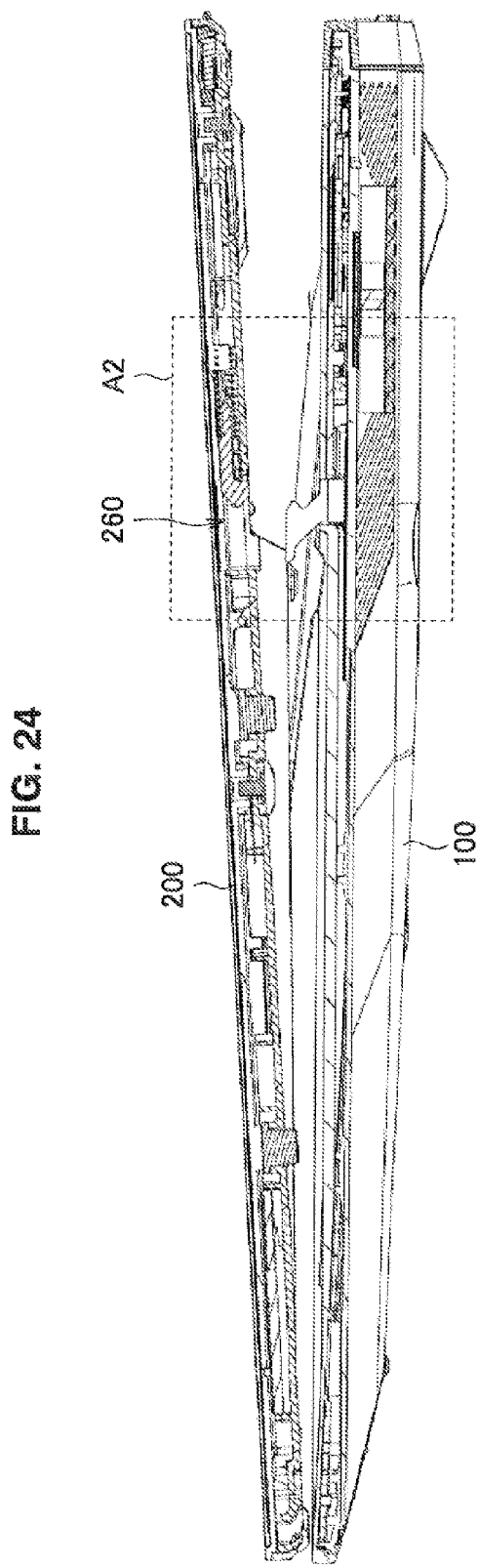
FIG. 24 is a schematic diagram illustrating a state immediately before the main unit and the display unit overlap when moving from the state illustrated in FIG. 2 to the state illustrated in FIG. 1.
Figure 25:
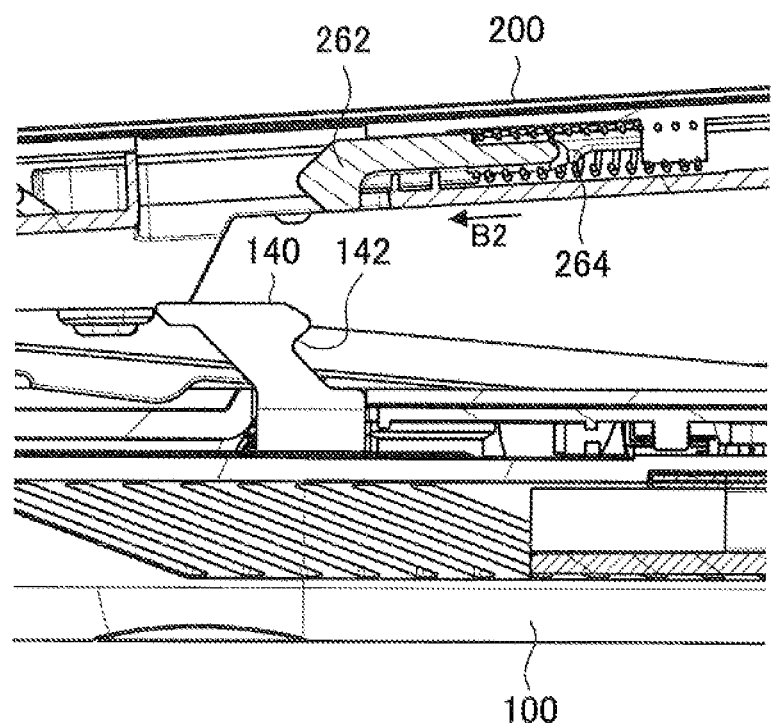
FIG. 25 is an enlarged cross-sectional view of area A2 in FIG. 24.

FIG. 24 is a schematic diagram illustrating a state immediately before the main unit 100 and the display unit 200 overlap when moving from the state illustrated in FIG. 2 to the state illustrated in FIG. 1. In this case, as illustrated in FIG. 24, a latch 260 provided on the display unit 200 moves towards the hook 140. FIG. 25 is an enlarged cross-sectional view of the area A2 in FIG. 24. The latch 260 is configured from a slider 262 and a compression spring 264. The slider 262 is urged in the direction of the arrow B2 by the compression spring 264. Further, a concave portion 142 that engages with the tip of the slider 262 is provided on the hook 140.

Figure 26:
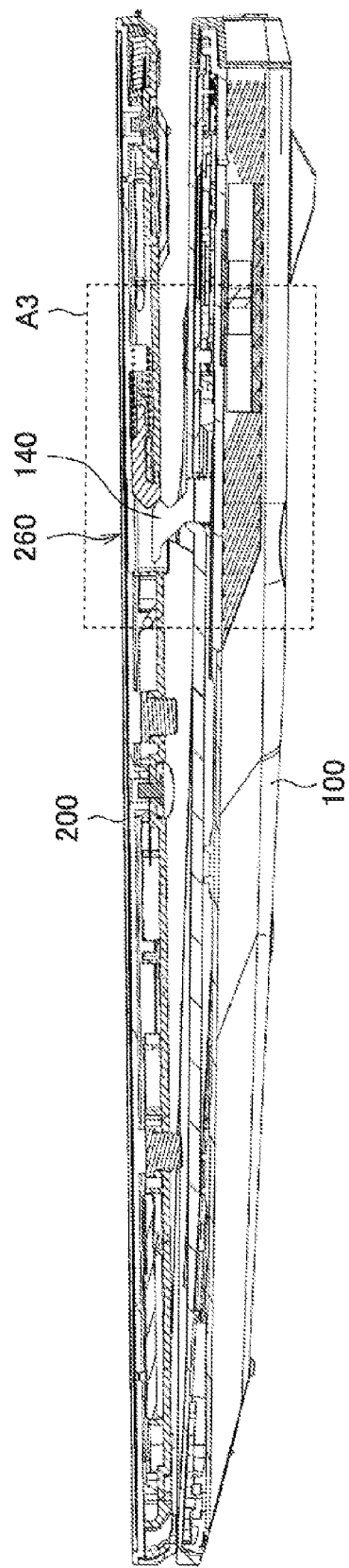
FIG. 26 is a schematic diagram illustrating a state in which a main unit 100 and a display unit 200 are in a state closer than that in FIG. 24 when moving from the state illustrated in FIG. 2 to the state illustrated in FIG. 1.
Figure 27:
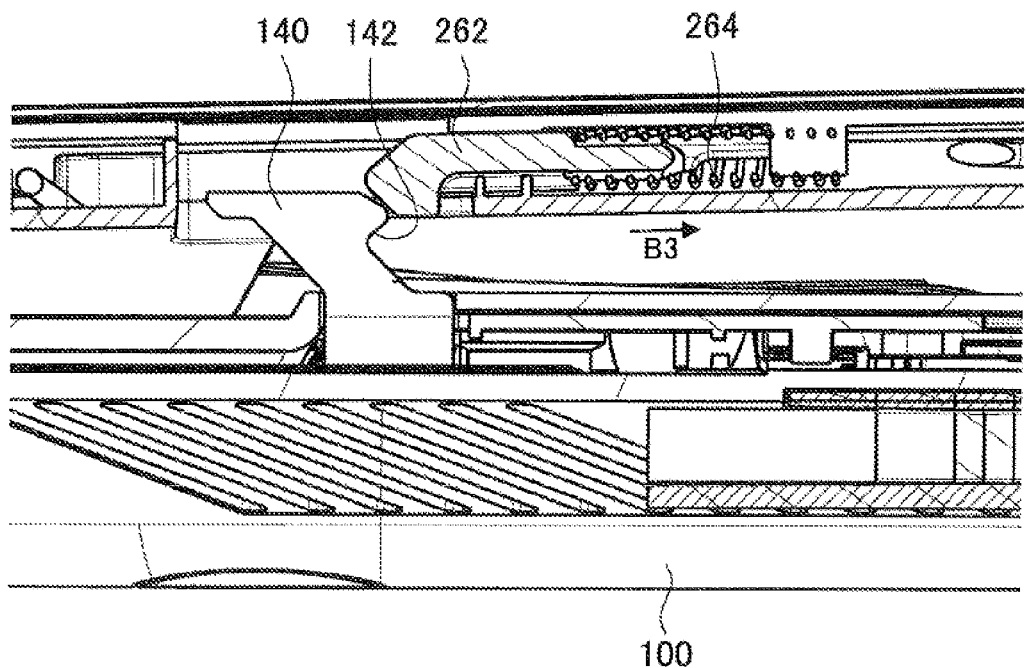
FIG. 27 is an enlarged cross-sectional view of area A3 in FIG. 26.

FIG. 26 is a schematic diagram illustrating a state in which the main unit 100 and the display unit 200 are in a state closer than that in FIG. 24 when moving from the state illustrated in FIG. 2 to the state illustrated in FIG. 1. Further, FIG. 27 is an enlarged cross-sectional view of area A3 in FIG. 26. In the state illustrated in FIGS. 26 and 27, the tip of the hook 140 abuts the slider 262, and the slider 262 moves in the direction of the arrow B3 in response to an urging force from the compression spring 264.

Figure 28:
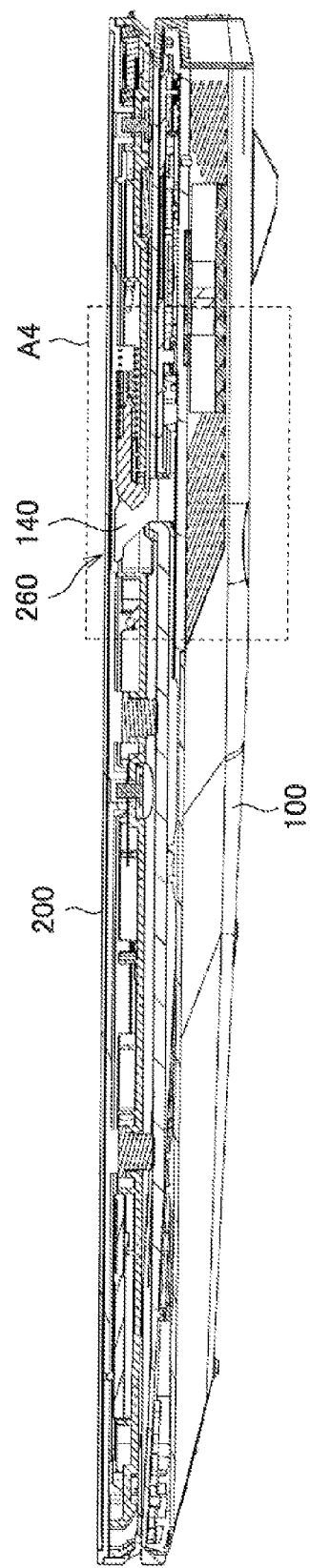
FIG. 28 is a schematic diagram illustrating a state in which the main unit and the display unit are completely overlapping (state illustrated in FIG. 1)
Figure 29:
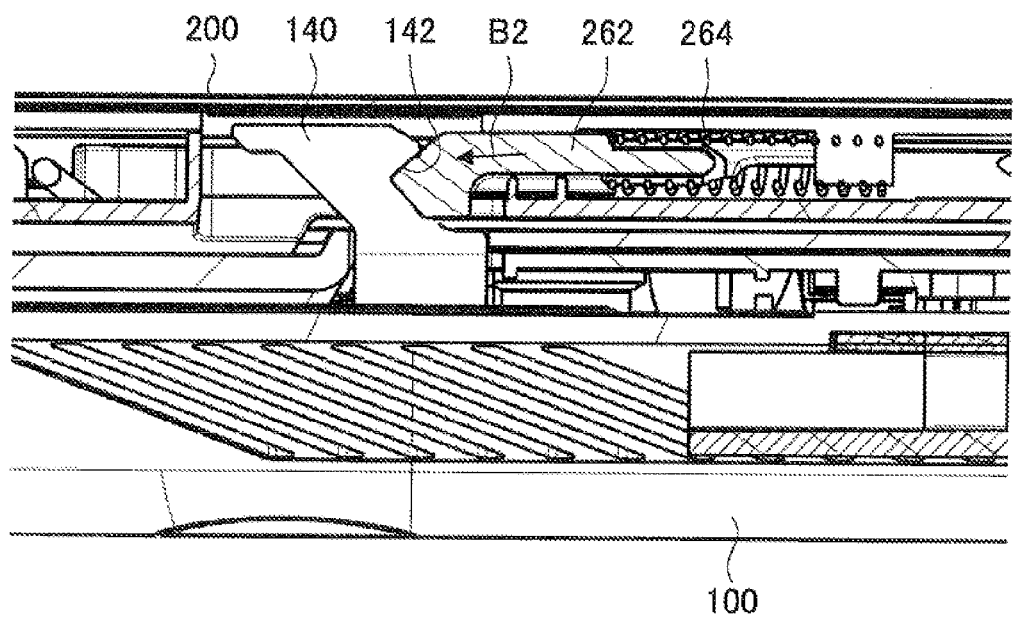
FIG. 29 is an enlarged cross-sectional view of area A4 in FIG. 28.

FIG. 28 illustrates a state in which the main unit 100 and the display unit 200 are completely overlapping (state illustrated in FIG. 1). Further, FIG. 29 is an enlarged cross-sectional view of the area A4 in FIG. 28. In the state illustrated in FIGS. 26 and 27, the slider 262 is urged in the direction of the arrow B2 by the compression spring 264, and the tip of the slider 262 engages the concave portion 142 of the hook 140. Due to the engagement of the tip of the slider 262 with the concave portion 142 of the hook 140, the display unit 200 is fixed to the main unit 100. In this state, the touch panel 210 of the display unit 200 faces upwards. Therefore, the user can use the information processing apparatus 1000 as a so-called tablet terminal.

When moving from the state illustrated in FIG. 1 to the state illustrated in FIG. 2, the display unit 200 is lifted up with respect to the main unit 100 so that the information processing apparatus 1000 changes from the state illustrated in FIG. 28 to the state illustrated in FIG. 26. Consequently, while following the shape of the concave portion 142, the slider 262 moves in the direction of the arrow B3 in response to an urging force from the compression spring 264. Therefore, the engagement between the hook 140 and the slider 262 is released, so that the display unit 200 can be surface-slid to the state illustrated in FIG. 2.

According to the present embodiment described above, in a configuration in which the display unit 200 surface-slides with respect to the main unit 100, since the hinge 300 overlaps the keyboard 110 when the display unit 200 is folded away, the obtained dedicated surface area of the keyboard 110 can be as large as possible, and a touch pad, a palm rest and the like can be arranged on the front face of the keyboard. Further, since the hinge 300 is configured so as to move along the curved cam 400, a desired movement for the hinge 300 can be realized, so that the lower edge of the display unit 200 can gracefully move across the upper face of the main unit 100.

It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

(1) An electronic device including:
a flat main unit provided with a keyboard;
a flat display unit having a display face, the flat display unit configured to movably slide between a first state that overlaps the main unit and a second state that is erect with respect to the main unit; and
a hinge that is arranged so as to overlap the keyboard in the first state, and is configured to couple the main unit and the display unit together so that the display unit can move with respect to the main unit, wherein the hinge includes a first hinge member that is rotatably configured about a first rotating central shaft with respect to the main unit and rotatably configured about a second rotating central shaft with respect to the display unit, and a second hinge member that is rotatably configured about a third rotating central shaft with respect to the main unit and rotatably configured about a fourth rotating central shaft with respect to the display unit, and wherein the hinge is configured so that the first rotating central shaft moves along a predetermined curve when the display unit moves between the first state and the second state with respect to the main unit.

(2) The electronic device according to (1),
wherein a cam groove is formed by the predetermined curve on the main unit, and
wherein the first rotating central shaft moves along the cam groove.

(3) The electronic device according to (1), wherein when the display unit is moved from the first state to the second state by the first rotating central shaft moving along the predetermined curve, a lower edge of the display unit moves across an upper face of the main unit.

(4) The electronic device according to (2), wherein when the display unit is moved from the first state to the second state by the first rotating central shaft moving along the predetermined curve, in between the first state and the second state, a lower edge of the display unit moves so as to rise above an upper face of the main unit.

(5) The electronic device according to (4), wherein an upper face of the keyboard is slanted with respect to an upper face of the main unit.

(6) The electronic device according to (1), wherein the hinge is arranged so as to extend toward a center in a width direction of the keyboard.

(7) The electronic device according to (1), wherein a pointing device is provided at an area on a near side of the keyboard.

(8) The electronic device according to (1), wherein the first and the second rotating central shafts are arranged in parallel on the main unit.

What is claimed is:

1. An electronic device comprising:
   a flat main unit provided with a keyboard;
   a flat display unit having a display face, the flat display unit configured to movably slide between a first state that overlaps the main unit and a second state that is erect with respect to the main unit; and
   a hinge that is arranged so as to overlap the keyboard in the first state, and is configured to couple the main unit and the display unit together so that the display unit can move with respect to the main unit,
   wherein the hinge includes a first hinge member that is rotatably configured about a first joint with respect to the main unit and rotatably configured about a second joint with respect to the display unit, a second hinge member that is rotatably configured about a third joint with respect to the main unit and rotatably configured about a fourth joint with respect to the display unit, and a third hinge member that is rotatably configured about a fifth joint with respect to the second hinge member and rotatably connected to the first joint, and
   wherein the hinge is configured so that the first joint moves along a predetermined curve when the display unit moves between the first state and the second state with respect to the main unit.

2. The electronic device according to claim 1,
   wherein a cam is formed on the main unit to provide the predetermined curve, and
   wherein the first joint moves in accordance with the cam.

3. The electronic device according to claim 1, wherein when the display unit is moved from the first state to the second state by the first joint moving along the predetermined curve, a lower edge of the display unit moves across an upper face of the main unit.

4. The electronic device according to claim 2, wherein when the display unit is moved from the first state to the second state by the first joint moving along the predetermined curve, in between the first state and the second state, a lower edge of the display unit moves so as to rise above an upper face of the main unit.

5. The electronic device according to claim 4, wherein an upper face of the keyboard is slanted with respect to an upper face of the main unit.

6. The electronic device according to claim 1, wherein the hinge is arranged so as to extend toward a center in a width direction of the keyboard.

7. The electronic device according to claim 1, wherein a pointing device is provided at an area on a near side of the keyboard.

8. The electronic device according to claim 1, wherein the first and the second joints are arranged in parallel on the main unit.

* * * * *